(12) United States Patent
Rollins et al.

(10) Patent No.: US 10,447,211 B2
(45) Date of Patent: Oct. 15, 2019

(54) LEAST MEAN SQUARES ADAPTATION OF A CONCURRENT MULTI-BAND PRE-DISTORTER USING OVERLAPPING SPINES

(71) Applicant: Telefonaktiebolaget LM Ericsson (publ), Stockholm (SE)

(72) Inventors: Mark Rollins, Stittsville (CA); Arthur T. G. Fuller, Kanata (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 152 days.

(21) Appl. No.: 15/737,004

(22) PCT Filed: Jun. 17, 2015

(86) PCT No.: PCT/IB2015/054583
§ 371 (c)(1),
(2) Date: Dec. 15, 2017

(87) PCT Pub. No.: WO2016/203294
PCT Pub. Date: Dec. 22, 2016

(65) Prior Publication Data
US 2018/0375480 A1  Dec. 27, 2018

(51) Int. Cl.
*H03F 1/32* (2006.01)
(52) U.S. Cl.
CPC ......... *H03F 1/3252* (2013.01); *H03F 1/3247* (2013.01); *H03F 1/3258* (2013.01); *H03F 1/3294* (2013.01)
(58) Field of Classification Search
CPC ...................................................... H03F 1/32

USPC .......................................... 330/149; 375/297
See application file for complete search history.

(56) References Cited

U.S. PATENT DOCUMENTS

| 10,075,324 | B2* | 9/2018 | Zhao ..................... H03F 1/3247 |
| 2003/0058959 | A1 | 3/2003 | Rafie et al. |
| 2005/0085199 | A1 | 4/2005 | Khan |
| 2008/0094139 | A1 | 4/2008 | Takano et al. |
| 2010/0277236 | A1 | 11/2010 | Horiguchi et al. |

(Continued)

OTHER PUBLICATIONS

R.D. Gitlin et. al., "The Tap-Leakage Algorithm: An Algorithm for the Stable Operation of a Digitally Implemented, Fractionally Spaced Adaptive Equalizer", Bell System Technical Journal, vol. 61(8):1817-1839, Oct. 1, 1982 consisting of 23-pages.

(Continued)

*Primary Examiner* — Henry Choe
(74) *Attorney, Agent, or Firm* — Sage Patent Group

(57) ABSTRACT

A method and system for digital pre-distortion of an input signal to compensate for non-linear operation of a power amplifier. According to one aspect, some embodiments provide overlapping spline functions that are defined for two adjacent bins, where any two spline functions overlap in only one bin. Each spline function is computed as a function of one of an input signal envelope and a delayed signal envelope. According to another aspect, a tap weight evaluator includes a least mean squares, LMS, tap correlator updater configured to modulate a step size of an adaptation process to update each tap weight, the step size being modulated based on an approximate logarithm of the average power of the input to a tap weight computation.

23 Claims, 24 Drawing Sheets

(56) References Cited

U.S. PATENT DOCUMENTS

| | | |
|---|---|---|
| 2015/0054585 A1 | 2/2015 | Chang |
| 2017/0005676 A1* | 1/2017 | Yan ..................... H04B 1/0475 |
| 2017/0047954 A1* | 2/2017 | Tian ..................... H04B 1/0475 |

OTHER PUBLICATIONS

B. Widrow, "Adaptive Inverse Control," Plenary Paper, IFAC Adaptive Systems in Control and Signal Processing, Lund, Sweden, (1986) consisting of 5-pages.

V.J. Mathews, "Orthogonalization of Correlated Gaussian Signals for Volterra System Identification", IEEE Signal Processing Letters, vol. 2(10)188-190, ISSN: 1070-9908, INSPEC Accession No. 5088592, DOI: 10.1109/97.466706, Oct. 1995 consisting of 3-pages.

D.R. Morgan et al., "A Generalized Memory Polynomial Model for Digital Predistortion of RF Power Amplifiers", IEEE Transactions on Signal Processing, vol. 54(10)3852-3860, ISSN: 1053-587X, INSPEC Accession No. 9093901, DOI: 10.1109/TSP.2006.879264, Oct. 2006 consisting of 9-pages.

N. Safari et. al., "Spline-Based Model for Digital Predistortion of Wide-Band Signals for High Power Amplifier Linearization", Published in: IEEE MTT-S International Microwave Symposium (IMS), pp. 1441-1444, ISSN : 0149-645X, DOI: 10.1109/MWSYM.2007.380504, E-ISBN: 1-4244-0688-9, Print ISBN: 1-4244-0688-9, INSPEC Accession No. 9718856, Conference Location and Date: Honolulu, HI, Jun. 3, 2007 consisting of 3-pages.

H. Paaso and A. Mammela, "Comparison of Direct Learning and Indirect Learning Predistortion Architectures", IEEE International Symposium on Wireless Communications Systems (ISWCS), pp. 309-313, E-ISBN: 978-1-4244-2489-4, DOI: 10.1109/ISWCS.2008.4726067, Print ISBN: 978-1-4244-2488-7, INSPEC Accession No. 10439253, Conference Location and Date: Reykjavik, Iceland, Oct. 21, 2008 consisting of 5-pages.

Wu et. al., "A Spline-Based Hammerstein Predistortion for 3G Power Amplifiers with Hard Nonlinearities", IEEE 2nd International Conference on Future Computer & Communications (ICFCC), vol. 3:741-745, Print ISBN: 978-1-4244-5821-9, DOI: 10.1109/ICFCC.2010.5497423, INSPEC Accession No. 11538280, Conference Location and Date: Wuhan, China, May 21-24, 2010 consisting of 5-pages.

Xiaofang Wu and Jianghong Shi, "Adaptive Predistortion Using Cubic Spline Nonlinearity Based Hammerstein Modeling," The Institute of Electronics, Information and Communication Engineers (IEICE) Transactions on Fundamentals of Electronics, Communications and Computer Sciences, Engineering Sciences Society, Tokyo, Japan, vol. E95.A(2):542-549, XP001573167, ISSN: 0916-8508, DOI: 10.1587/transfun.E95.A.542 Feb. 1, 2012, consisting of 8-pages.

Y-J. Liu et. al., "Low-complexity 2D Behavioural Model for Concurrent Dual-Band Power Amplifiers", Published in: Electronics Letters, vol. 48(11):620-621, ISSN: 0013-5194, INSPEC Accession No. Accession No. 12746862, DOI: 10.1049/el.2012.1183 May 24, 2012 consisting of 2-pages.

Y-J Liu et. al., "Digital Predistortion for Concurrent Dual-Band Transmitters Using 2-D Modified Memory Polynomials", IEEE Transactions on Microwave Theory and Techniques, vol. 61(1):281-290, ISSN:0018-9480, INSPEC Accession No. 13244791, DOI: 10.1109/TMTT.2012.2228216, Dec. 21, 2012 consisting of 10-pages.

S. Chen et al., "Digital Predistorter Design Using B-Spline Neural Network and Inverse of De Boor Algorithm" Published in: IEEE Transaction on Circuits and Systems I: Regular Papers, vol. 60(6):1584-1594, ISSN :1549-8328, DOI:10.1109/TCSI.2012.2226514, Date of Publication: Mar. 7, 2013 consisting of 11-pages.

International Search Report and Written Opinion of the International Searching Authority issued in corresponding PCT Application Serial No. PCT/IB2015/054583 dated Jun. 9, 2016 and consisting of 13-pages.

G. Xu et al., "Generalized Two-Box Cascaded Nonlinear Behavioral Model for Radio Frequency Power Amplifiers With Strong Memory Effects," Published in: IEEE Transaction on Microwave Theory and Techniques, vol. 62 (12):2888-2899, ISSN :0018-9480, INSPEC Accession No. 14805321, DOI: 10.1109/TMTT.2014.2365459, Sponsored by: IEEE Microwave Theory and Techniques Society, Publication Date: Dec. 2014 consisting of 12-pages.

F.M. Barradas et al., "Using Splie Babis Functions in Volterra Series Based Models" 2014 International Workshop on Integrated Nonlinear Microwave and Millimetre-wave Circuits (INMMiC), Aveiro, Portugal, IEEE Publication, consisting of 3-pages.

N. Naraharisetti et al. "2D Cubic Spline Implementation for Concurrent Dual-Band System", Conference on: IEEE MTT-S International Microwave Symposium (IMS), pp. 1-4, ISSN: 0149-645X, DOI: 10.1109/MWSYM.2013.6697739 Print ISBN: 978-1-4673-6177-4, INSPEC Accession No. 14022053, Conference Location and Date: Seattle, WA,, USA, Jun. 2-7, 2013 consisting of 3-pages.

Extended European Search Report dated Dec. 5, 2018 issued in corresponding European Patent Application No. 18184909.2, consisting of 5 pages.

* cited by examiner

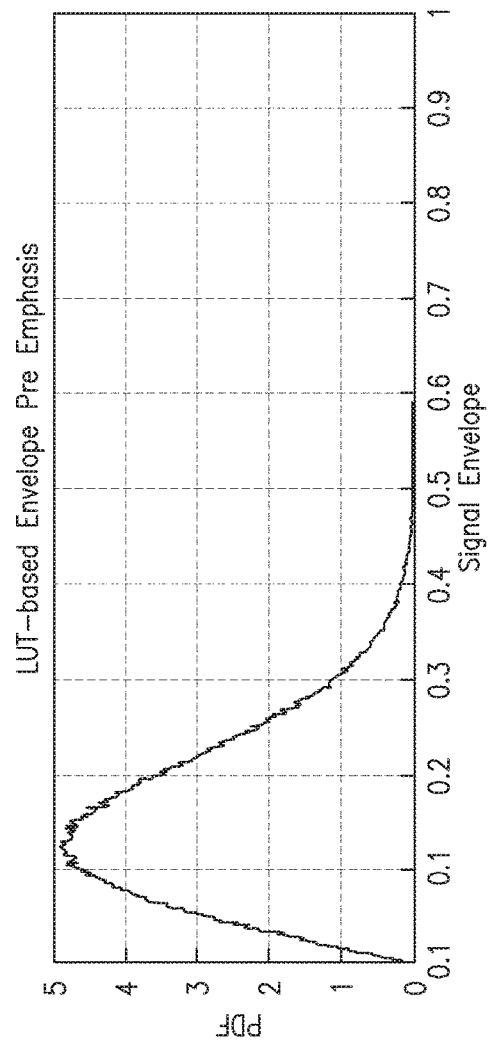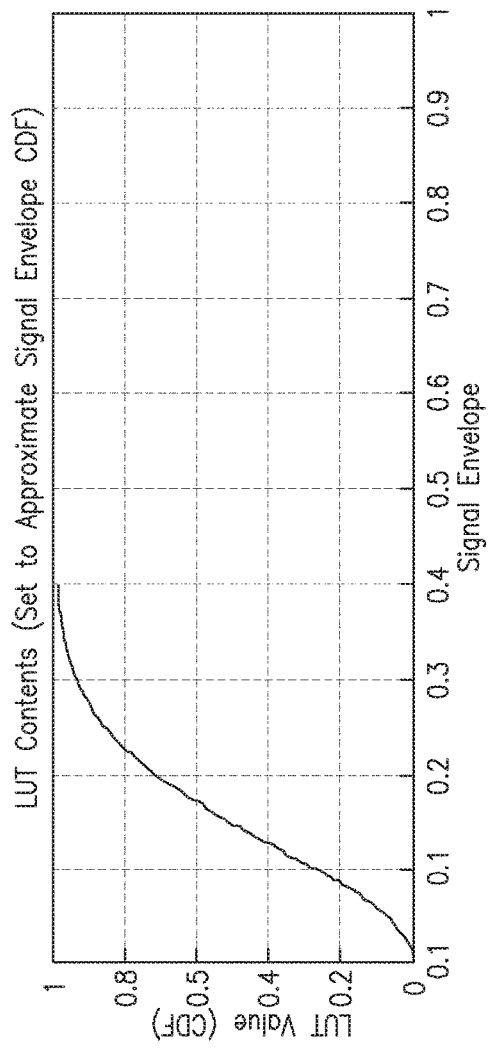

FIG. 9c

LEAST MEAN SQUARES ADAPTATION OF A CONCURRENT MULTI-BAND PRE-DISTORTER USING OVERLAPPING SPINES

CROSS-REFERENCE TO RELATED APPLICATIONS

This application is a Submission Under 35 U.S.C. § 371 for U.S. National Stage Patent Application of International Application Number: PCT/IB2015/054583, filed Jun. 17, 2015 entitled "LEAST MEAN SQUARES ADAPTATION OF A CONCURRENT MULTI-BAND PRE-DISTORTER USING OVERLAPPING SPINES" which is incorporated herein by reference.

TECHNICAL FIELD

Power amplification and in particular to pre-distortion of signals to compensate for a non-linear operation of a power amplifier.

BACKGROUND

Digital pre-distortion (DPD) employs digital signal processing (DSP) techniques to impress an "inverse characteristic" of a Power Amplifier (PA) on an input signal to compensate for the non-linear distortion of the PA. Typically, the distortion function is modeled as a sum of output signals produced from (non-orthogonal) basis functions weighted by a corresponding set of complex-valued tap coefficients as in the generalized memory polynomial (GMP) framework.

Recent advanced transmitter architectures in wireless communication systems seek the capability to service signals in multiple bands concurrently as a means to lower cell site cost and complexity. Concurrent dual-band systems require DPD with much higher computational complexity since nonlinear behavior of concurrent dual-band PA's includes both intra-band and inter-band distortion products. For example, a concurrent dual-band GMP framework requires extension to two dimensions, leading to a significant increase in computational complexity required for 2D-DPD.

FIG. 1 shows a typical "concurrent dual-band" system 10 using baseband DPD implemented by a pre-distortion system 12. The pre-distortion system 12 receives complex-valued baseband information-bearing signals $u_L(n)$ and $u_U(n)$ for the lower and upper bands from a lower and upper band source 14$a$ and 14$b$, respectively. The signals $u_L(n)$ and $u_U(n)$, are pre-distorted by a pair of digital pre-distorters 16$a$, and 16$b$, referred to collectively herein as digital pre-distorters 16, to produce the complex-valued baseband distorted signals $y_L(n)$ and $y_U(n)$. The signals from both bands, $y_L(n)$ and $y_U(n)$, are up-converted by an upconverter 18 to analog signal $\tilde{z}_i(t)$ at frequency $\omega_c$ and input to a power amplifier (PA) 20 to produce the real-valued output signal $\tilde{z}_o(t)$ to be transmitted over the air. The system is considered "concurrent dual-band" since the PA transmits both bands simultaneously and treats them as a single contiguous region of frequency of width W—even if the spacing between bands spans several hundreds of MHz.

A transmit observation receiver 22 that includes a down converter and digitizer 24, down-converts and digitizes the analog PA output signal $\tilde{z}_o(t)$ as observed via a coupler. A "Tap Weight Evaluation" block 26 produces a set of tap weights, also referred to simply as taps, required for each band based on the baseband samples $r_L(n)$ and $r_U(n)$ observed on both bands by the observation receiver 22. Tap weight adaptation requires access to either the DPD actuator input signals $u_L(n)$ and $u_U(n)$ or its output signals $y_L(n)$ and $y_U(n)$, depending on whether the DPD system employs a "direct learning" or "indirect learning" architecture. Most often, only one of the learning architectures is selected for any given system based on the nature of its PA nonlinearity or its chosen adaptation scheme.

Equations 1 show a signal implementation of a typical baseband DPD architecture for a concurrent dual-band system. A subsystem of the pre-distorter system 12, includes a pair of pre-distorter actuators, one for each band that calculates the pre-distorted signals as follows:

$$y_L(n) = \sum_{m=0}^{M-1}\sum_{b=0}^{B-1} w_L(m,b) \cdot \psi_{L,b}(|u_L(n-m)|, |u_U(n-m)|) \cdot u_L(n-m)$$

$$y_U(n) = \sum_{m=0}^{M-1}\sum_{b=0}^{B-1} w_U(m,b) \cdot \psi_{U,b}(|u_L(n-m)|, |u_U(n-m)|) \cdot u_U(n-m)$$

Equation 1

The lower band actuator synthesizes its desired pre-distorted output $y_L(n)$ by summing together over a memory depth of M samples the outputs from B basis functions $\psi_{L,b}(\bullet)$ scaled by the lower band signal $u_L(n-m)$ and weighted by the complex-valued tap weights $\{w_L(n-m,b)\}$. Similarly, the upper band actuator produces $y_U(n)$ similarly using B basis functions $\psi_{U,b}(\bullet)$ and tap weights $\{w_U(n-m,b)\}$. For effective dual-band pre-distortion, the basis functions $\psi_{L,b}(\bullet)$ and $\psi_{U,b}(\bullet)$ must be smooth continuous functions of the signal envelopes $|u_L(n)|$ and $|u_U(n)|$ in each band capable of synthesizing nonlinear distortion products of sufficient order as produced by the PA to be linearized.

A commonly used scheme adopts a dual-band extension of the "Generalized Memory Polynomial" (GMP) scheme, referred to as "2D-DPD". In this case, Equations 1 takes the form shown in Equations 2, where Q+1 represents the maximum order of the nonlinearity in question.

$$y_L(n) = \sum_{m=0}^{M-1}\sum_{q=0}^{Q}\sum_{p=0}^{q} w_L(m,q,p) \cdot |u_L(n-m)|^{q-p} \cdot |u_U(n-m)|^p \cdot u_L(n-m)$$

$$y_U(n) = \sum_{m=0}^{M-1}\sum_{q=0}^{Q}\sum_{p=0}^{q} w_U(m,q,p) \cdot |u_U(n-m)|^{q-p} \cdot |u_L(n-m)|^p \cdot u_U(n-m)$$

Equation 2

The use of classical polynomials as basis functions for pre-distortion (as in the GMP method) leads to a number of implementation difficulties. A low order polynomial cannot provide a good fit to a general non-linear response over the full dynamic range of the input signal. Computation of high order polynomial terms cannot be done accurately in fixed-point with limited precision. These limitations may be avoided in practice with the use of lower-order splines.

An illustrative example of spline-based DPD for the single-band case is shown in FIG. 2. The basic idea is to approximate the basis function $\psi(|u(n-1)|)$ as a piecewise approximation of a low order polynomial in the form of a "Catmull-Rom" cubic spline. Typically, third order (or cubic) splines are used since they are easy to compute and have continuous first and second order derivatives yielding well-behaved approximations. As shown in FIG. 2, the input signal envelope |u(n−1)| is divided into B intervals or "bins", and the borders between the bins are denoted as "knots" $q_0, q_1, \ldots, q_K$. In between each pair of knots, the basis function $\psi(|u(n-1)|)$ is approximated by a cubic spline that is forced by construction to be continuous at the knots. The knot positions may be distributed uniformly to reduce computational complexity.

When the signal envelope |u(n−1)| falls within the "p-th" bin as shown in FIG. 2, then the basis function $\psi(|u(n-1)|)$ may be approximated by fitting a cubic spline to the four knots surrounding that bin using the corresponding ordinates {Q(p−1),Qp Q(p+1), Q(p+2)}, which must be estimated for a particular PA. Based on the formulation of a Hammerstein pre-distorter model, the above cubic spline approximation is incorporated for the required non-linearity into the DPD actuator model given by Equations 3, where w(m) denotes a set of complex-valued tap weights, M is the basis of the Catmull-Rom spline, and the abscissa {q(p−1),q(p), q(p+1), q(p+2)} for the knot points are assumed to be uniformly distributed.

$$y(n-m) = \sum_{m=0}^{M-1} w(m) \cdot T_p(|u(n-m)|) \cdot M \cdot Q_p \qquad \text{Equations 3}$$

$$T_p(u) = [u^3, u^2, u, 1]$$

$$M = \frac{1}{2}\begin{bmatrix} -1 & 3 & -3 & 1 \\ 2 & -5 & 4 & -1 \\ -1 & 0 & 1 & 0 \\ 0 & 2 & 0 & 0 \end{bmatrix}$$

$$Q_p = [Q_{p-1}, Q_p, Q_{p+1}, Q_{p+2}]^T$$

Other choices for the cubic spline may be used, although the schemes that result are very similar. For example, Equation 4 provides the DPD actuator operation for a single-band actuator based on a second version of cubic splines, where {α(j,m)} and {β(p,m)} represent the complex-valued tap weights for the actuator. Note that separate cubic spline fitting is done for each memory term supported by the actuator.

$$y(n) = \sum_{m=0}^{M-1} u(n-m) \cdot \sum_{j=1}^{K_m-1} \alpha(j,m) \cdot ||u(n-m)| - k_j|^3 + \sum_{p=0}^{3} \beta(p,m) \cdot |u(n-m)|^p \qquad \text{Equation 4}$$

Often spline-based DPD schemes are implemented using lookup tables (LUTs) to reduce complexity, rather than computing explicitly the cubic terms in Equation 3 or Equation 4 based on the four knots for a particular bin. Instead, the dynamic range for the abscissa of the p-th bin shown in FIG. 2 may be quantized to a finite fixed-point resolution and the cubic spline computations may be pre-computed a-priori for each possible quantized signal envelope value and stored in a LUT. The LUT provides a cheap hardware mechanism to implement the DPD actuator, but complicates the fast adaptation of the tap weights since every time the tap weights need to be updated, the entire contents of the LUTs must be re-computed.

The single-band DPD schemes based on cubic splines may be extended to support concurrent dual-band operation by synthesizing 1D splines independently for each band and then extending them to 2D via a tensor product of the 1D cubic spline interpolations in each band. One example of this approach is to produce a 2D-DPD scheme based on cubic splines and implemented using lookup tables (LUTs). Equation 5 shows the resultant tensor product of the 1D cubic splines, where $x_L$ and $x_U$ represent the baseband input signals of each band, u denotes the 1D knot index for the signal amplitude of the lower band, and v denotes the 1D knot index for the signal amplitude of the upper band. The expression in Equation 5 would be evaluated at each memory term supported by the actuator.

$$S_{u,v} = \sum_{i=0}^{3} \sum_{j=0}^{3} a_{i,j} \cdot [(|x_L|^2 - |x_u|^2)^i \cdot (|x_U|^2 - |x_v|^2)^j] \qquad \text{Equation 5}$$

Clearly, from Equation 5, extending the cubic spline pre-distorter equations from single-band to dual band results in a significant increase in computational complexity due to the squaring of the terms involved in the distortion products; a 1D cubic spline with 3rd order terms results in 6th order terms to be computed when a 2D cubic spline is formed as a tensor product of 1D cubic splines.

Dual-band DPD such as 2D-DPD based on GMPs admit the use of a wide variety of tap weight adaptation and tracking schemes because their outputs are expressed as a linear function of their tap weights. However, a number of significant drawbacks exist. For example:

All orders of non-linear distortion products must be included explicitly in the model a-priori. Consequently, the DPD must be provisioned to compute the worst-case maximum non-linear order expected over a wide variety of PA's. This increases computational complexity significantly, especially if the DPD solution is to be flexible and robust over a wide variety of PA topologies.

Computation of the high order polynomial terms required for 2D-DPD cannot be done simply and accurately in fixed-point with limited precision. Often, complicated hardware schemes based on logarithmic shifts are required to manage the dynamic range issues associated with GMP formulations.

The 2D-DPD actuator in Equation 2 exhibits high complexity, a lack of flexibility in supporting time-skewed distortion products, and the need to extract PA-specific "envelope coupling factors" via a model extraction procedure that requires tens of matrix inversion operations that are difficult to implement efficiently in hardware. Low-complexity variants exist, but they retain the same drawbacks as outlined above.

Cubic splines can address issues with high order non-linearity and the fixed-point dynamic range issues found in GMP-based schemes but they also suffer from serious drawbacks when used to implement concurrent dual-band pre-distortion:

When implemented directly in hardware, the computational complexity of 2D distortion products based on a tensor product of 1D cubic-splines becomes prohibitive for the dual-band case, where 3rd order polynomials expand to polynomial expressions of 6th order with tens of terms to be evaluated.

When implemented indirectly via LUTs, the increased computational burden of the 2D cubic splines is avoided but the depth of the tables becomes infeasible to implement with sufficient resolution. For example, assuming the table input may be quantized to 12 bits for sufficient performance, a dual-band distortion product comprised of a 2D index of 12+12=24 bits implies a LUT depth of greater than 16 Mega-words for only a single bin.

Adaptation of a LUT-based cubic spline scheme becomes increasingly prohibitive as well, due to the squaring in the size of the LUT contents that must be recomputed when the tap weights are updated in real time by a suitable closed-loop procedure.

Due to the Gaussian nature of constituent wideband signals, a dual-band LTE signal exhibits a strong concentration of its joint envelope in the bottom left corner of the 2D signal envelope plane. Consequently, dual-band DPD schemes based on conventional cubic splines perform poorly as those schemes do not properly account for this concentration of the signal envelope in their formulation.

Conventional DPD systems commonly employ either "indirect learning" or "direct learning" architectures for tap weight adaptation. Most often, only one of the learning architectures is suitable for any given system based on the nature of the PA nonlinearity or its chosen adaptation scheme. Both architectures form particular embodiments of the classical "inverse or self-tuning control" problem. Consequently, the Tap Weight Evaluation block 26 in FIG. 1 typically adopts one of these architectures but not both.

The indirect learning architecture, shown in FIG. 3, acts fundamentally to "post-distort" the PA output $\tilde{z}_o(t)$ by passing its baseband equivalent r(n) through a "reverse" DPD actuator model 28. The tap weights of the reverse DPD actuator model 28 are updated or tuned by tap weight updater 30 to drive to zero the error signal e(n) between an y(n) of a DPD actuator 32 and the output of the reverse DPD actuator model 28. The tap weights of the reverse DPD actuator model 28 may then be transferred for use in the forward DPD actuator 32.

The direct learning architecture, shown in FIG. 4, acts fundamentally to "pre-distort" the PA in the "forward" direction by using the baseband actuator input u(n) as the ideal reference signal for tap adaptation, and tuning to zero the error signal e(n) formed between this ideal reference and the observed r(n) from the PA output. Thus, r(n), the baseband equivalent of $\tilde{z}_o(t)$ is received by a DPD actuator model 29 which receives u(n) and presents an output to the tap weight updater 31. The tap weight updater 31 receives an error signal e(n) which is the difference between r(n) and u(n). The weights are applied to the DPD actuator 33 which produces the pre-distorted signal y(n). Note that although the DPD actuator model 29 is shown explicitly in FIG. 4 for clarity, in principle its function can be absorbed into the actual DPD actuator 33. More sophisticated "direct learning" architectures incorporate explicit PA model identification with inner & outer control loops as required for general "self-tuning inverse control" systems.

SUMMARY

The present disclosure advantageously provides method and systems for digital pre-distortion of an input signal to compensate for non-linear operation of a power amplifier. According to one aspect, some embodiments provide, for each of at least one band of the input signal, determining a signal envelope, a signal envelope being determined for each of a plurality of successive bins, each bin having a knot at each edge of the corresponding bin. The method includes computing a spline function assigned to each knot, the spline function having a left spline and a right spline. Each of the left spline and the right spline have a value of unity at the knot and a value of zero at left and right neighboring knots, respectively. Consequently, each bin is associated with two overlapping successive spline functions that overlap each other in only one bin. Each spline function is computed as a function of one of the signal envelope and a delayed signal envelope in the band. The method includes, for each bin, delaying one of the signal envelope and a spline function in each of at least one tap delay line to model a pre-selected memory depth. The method includes determining a tap weight for each knot; multiplying each spline function at each knot by its respective tap weight; and generating a pre-distorted signal using a sum of tap-weighted products of the spline functions and a delayed input signal.

According to this aspect, in some embodiments, when there are a plurality of bands, the method includes forming cross products of the spline functions of the different bands; and multiplying the cross products at each knot by a respective tap weight; and wherein generating the pre-distorted signal includes adding a sum of tap-weighted cross products to the sum of tap-weighted products. In some embodiments, when there are a plurality of bands, the method includes forming inter-band polar spline functions having a magnitude and phase based on the signal envelopes of the plurality of bands; and multiplying the inter-band polar spline functions at each of a plurality of radial knots by a respective tap weight at each knot; and wherein generating the pre-distorted signal includes adding a sum of tap-weighted polar spline functions to the sum of tap-weighted products. In some embodiments, for each band, the method includes scaling the signal envelope and computing the spline function as a function of one of the scaled signal envelope and a delayed scaled signal envelope.

In some embodiments, for each band, the method includes inputting the signal envelope to a pre-emphasis unit that maps each value of the signal envelope to a scaled value of the signal envelope. In some embodiments, the mapping is based on cumulative distribution function of the signal envelope. In some embodiments, the method includes selecting, by multiplexers, different ones of the delayed input signals and spline functions to be included in the pre-distorted signal. In some embodiments, the generating includes, for each band: storing each tap weight in a memory; multiplying the tap weights by spline functions in parallel branches to produce a first set of multiplications; combining the first set of multiplications; and multiplying the combined multiplications by a delayed input signal. In some embodiments, a spline function is given by:

$$\psi_2(a, u) = \begin{cases} \frac{1}{2}\left(\frac{u}{a/2}\right)^2, & 0 \le u \le a/2 \\ 1 - \frac{1}{2}\left(\frac{u-a}{a/2}\right)^2, & a/2 \le u \le 3a/2 \\ \frac{1}{2}\left(\frac{2a-u}{a/2}\right)^2, & 3a/2 \le u \le 2a \end{cases}$$

where "a" is a stretching parameter equal to a bin width, so that the spline function spans a width of two bins. In some embodiments, a spline function is given by:

$$\psi_3(a, u) = \begin{cases} 2\left(\frac{a-x}{a}\right)^2 \cdot \left[\left(\frac{a-x}{a}\right) - \frac{3}{2}\right] + 1, & 0 \le u \le a \\ 2\left(\frac{x-a}{a}\right)^2 \cdot \left[\left(\frac{x-a}{a}\right) - \frac{3}{2}\right] + 1, & a \le u \le 2a \end{cases}$$

where "a" is a stretching parameter equal to a bin width, so that the spline function spans a width of two bins. In some embodiments, the left spline is associated with a first stretching parameter and the right spline is associated with a second stretching parameter different from the first stretching parameter to accommodate adjacent bins of unequal width. In some embodiments, calculating the sum of tap-weighted products includes, for each bin: multiplying a tap weight determined for a left knot of the bin by a right spline of the left knot to form a first product; multiplying a tap weight determined for a right knot of the bin by a left spline of the right knot to form a second product; summing the first product and the second product to form a first sum; and multiplying the first sum by a value of the delayed input signal.

According to another aspect, some embodiments provide a digital pre-distorter, DPD, configured to pre-distort an input signal to compensate for a non-linear operation of a power amplifier. The DPD includes an envelope detector configured to determine a signal envelope for each of at least one band of the input signal, a signal envelope being determined for each of a plurality of successive bins, each bin having a knot at each edge of the corresponding bin. The DPD includes a spline function calculator configured to compute and assign, for each band, a spline function to each knot. The spline function has a left spline and a right spline, each of the left spline and the right spline having a value of unity at the knot and a value of zero at left and right neighboring knots, respectively. Consequently, each bin is associated with two overlapping successive spline functions that overlap each other in only one bin. Also, each spline function is computed as a function of one of the signal envelope and a delayed signal envelope in the band. The DPD also includes tapped delay lines configured to delay, for each bin, one of the signal envelope and a spline function to model a pre-selected memory depth. The DPD also includes a combiner configured to multiply tap weights by the spline functions and delayed input signals to form tap weighted products and to combine the tap weighted products to generate a pre-distorted signal.

According to this aspect, in some embodiments, a set of multipliers form cross products of the spline functions of different bands and multiply each cross product at each knot by a respective tap weight. The combiner generates the pre-distorted signal by adding a sum of tap-weighted cross products to the combination of tap-weighted products. In some embodiments, when there are a plurality of bands, the spline function calculator forms inter-band polar spline functions having a magnitude and phase based on the signal envelopes of the plurality of bands. In these embodiments, the combiner is configured to multiply the inter-band polar spline functions at each of a plurality of radial knots by a respective tap weight at each knot; and where generating the pre-distorted signal includes adding a sum of tap-weighted polar spline functions to the sum of tap-weighted products. In some embodiments, the DPD includes a pre-emphasis unit configured to scale the signal envelope prior to computing the spline function as a function of one the scaled signal envelope and a delayed scaled signal envelope. In some embodiments, the DPD further includes a pre-emphasis unit configured to map each value of the signal envelope to a scaled value of the signal envelope. In some embodiments, the mapping is based on the cumulative distribution function of the signal envelope. In some embodiments, the combiner includes, for each band: a memory configured to store each tap weight; a plurality of first multipliers configured to multiply the tap weights by spline functions in parallel branches; a combiner configured to combine the multiplications; and a second multiplier configured to multiply the combined multiplications by a delayed input signal. In some embodiments, a spline function is given by:

$$\psi_2(a, u) = \begin{cases} \frac{1}{2}\left(\frac{u}{a/2}\right)^2, & 0 \le u \le a/2 \\ 1 - \frac{1}{2}\left(\frac{u-a}{a/2}\right)^2, & a/2 \le u \le 3a/2 \\ \frac{1}{2}\left(\frac{2a-u}{a/2}\right)^2, & 3a/2 \le u \le 2a \end{cases}$$

where "a" is a stretching parameter equal to a bin width, so that the spline function spans a width of two bins. In some embodiments, a spline function is given by:

$$\psi_3(a, u) = \begin{cases} 2\left(\frac{a-x}{a}\right)^2 \cdot \left[\left(\frac{a-x}{a}\right) - \frac{3}{2}\right] + 1, & 0 \le u \le a \\ 2\left(\frac{x-a}{a}\right)^2 \cdot \left[\left(\frac{x-a}{a}\right) - \frac{3}{2}\right] + 1, & a \le u \le 2a \end{cases}$$

where "a" is a stretching parameter equal to a bin width, so that the spline function spans a width of two bins. In some embodiments, the left spline is associated with a first stretching parameter and the right spline is associated with a second stretching parameter different from the first stretching parameter to accommodate adjacent bins of unequal width. In some embodiments, the combiner includes, for each bin: a first multiplier configured multiply a tap weight determined for a left knot of the bin by a right spline of the left knot to form a first product; a second multiplier to multiply a tap weight determined for a right knot of the bin by a left spline of the right knot to form a second product; an adder to sum the first product and the second product to form a first sum; and a third multiplier to multiply the first sum by a value of the delayed input signal.

According to another aspect, some embodiments include a method of updating tap weights in a digital pre-distorter, DPD, the DPD configured to compensate for a non-linear operation of a power amplifier. The method includes computing an average power of each input to a plurality of tap weight calculators over a plurality of samples. The method also includes computing an approximate logarithm of the average power of each input; and modulating a step size of an adaptation process to update each tap weight. The step size is modulated based on the approximate logarithm of the average power of the input.

According to this aspect, the method includes computing the approximate logarithm which includes performing a binary shift of a correlation statistic associated with each tap weight. In some embodiments, the method further includes accumulating a computed power average during a first period of time in a first memory while reading a previously computed power average from a second memory, and accumulating a computed power average during a second period of time in the second memory while reading a previously computed power average from the first memory. In some embodiments, the method further includes further modulating the step size based on a sum of products of a vector of tap weight inputs and a conjugate of an error value, the summation being over a plurality of samples. In some embodiments, the products are computed with a first precision and then reduced to a second precision before being used to update the tap weights. In some embodiments, the method further includes selectively operating in one of a direct mode to compute a difference between an input signal and an observation signal and an indirect mode to compute a difference between an output of the DPD and an output of a DPD actuator model, the DPD actuator model computing an estimate of a pre-distorted signal. In some embodiments, the tap weights are based on spline functions, a spline function being a function of an envelope of an input signal to be pre-distorted, a spline function being assigned to each knot of a plurality of successive bins. A spline function has a left spline and a right spline, each of the left spline and the right spline having a value of unity at the knot and a value of zero at left and right neighboring knots, respectively, so that each bin is associated with two overlapping successive spline functions that overlap each other in only one bin.

According to another aspect, some embodiments provide a tap weight evaluator to update tap weights for use in conjunction with a digital pre-distorter, DPD, the DPD configured to compensate for a non-linear operation of a power amplifier. The tap weight evaluator includes an average power calculator configured to compute an average power of each input to a plurality of tap weight computations over a plurality of samples. The tap weight evaluator also includes a logarithm calculator configured to compute an approximate logarithm of the average power of each input. The tap weight evaluator further includes a least mean squares, LMS, tap correlator updater configured to modulate a step size of an adaptation process to update each tap weight. The step size is modulated based on the approximate logarithm of the average power of the input to the tap weight computation.

According to this aspect, in some embodiments, the logarithm calculator is configured to perform a binary shift of a correlation statistic associated with each tap weight. In some embodiments, the tap weight evaluator further includes memory circuitry configured to accumulate a computed power average during a first period of time in a first memory while a previously computed power average is read from a second memory, and configured to accumulate a computed power average during a second period of time in the second memory while a previously computed power average is read from the first memory. In some embodiments, the LMS tap correlator updater is further configured to further modulate the step size based on a sum of products of a vector of tap weight inputs and a conjugate of an error value, the summation being over a plurality of samples. In some embodiments, the products are computed with a first precision, and then reduced to a second precision before being used to update the tap weights. In some embodiments, the tap weight evaluator further includes an error signal calculator configured in a direct mode to compute a difference between an input signal and an observation signal and configured in an indirect mode to compute a difference between an output of the DPD and an output of a DPD actuator model, the DPD actuator model computing an estimate of a pre-distorted signal. In some embodiments, the tap weights are based on spline functions, a spline function being a function of an envelope of an input signal to be pre-distorted, a spline function being assigned to each knot of a plurality of successive bins. A spline function has a left spline and a right spline, each of the left spline and the right spline having a value of unity at the knot and a value of zero at left and right neighboring knots, respectively, so that each bin is associated with two overlapping successive spline functions that overlap each other in only one bin.

BRIEF DESCRIPTION OF THE DRAWINGS

A more complete understanding of the present disclosure, and the attendant advantages and features thereof, will be more readily understood by reference to the following detailed description when considered in conjunction with the accompanying drawings wherein:

FIG. 9 is an illustration of a probability density function, cumulative distribution function and resultant overlapping splines having non-equal bin widths;

DETAILED DESCRIPTION

Figure 1:
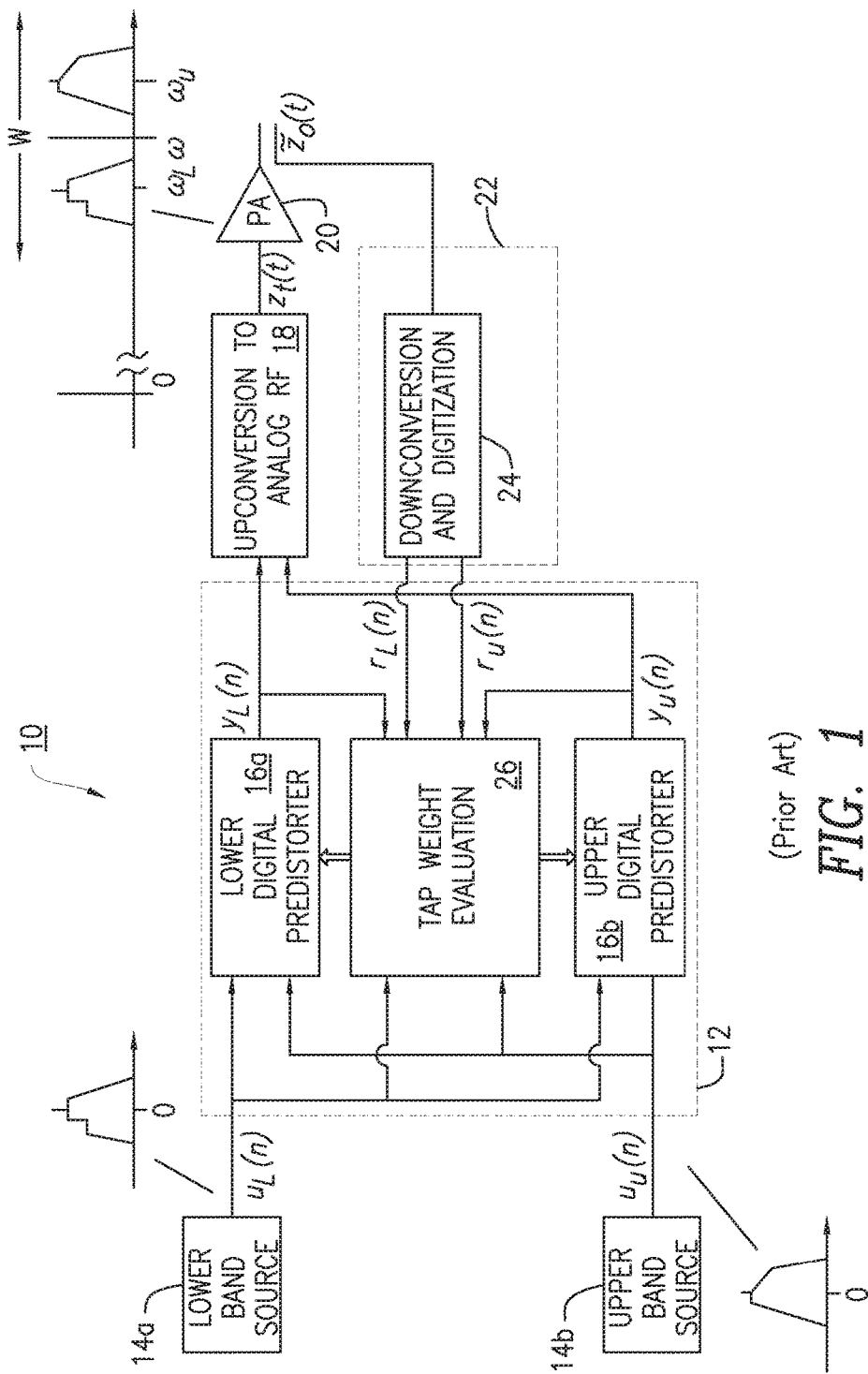
FIG. 1 is a block diagram of a power amplifier system with digital pre-distortion (DPD)
Figure 2:
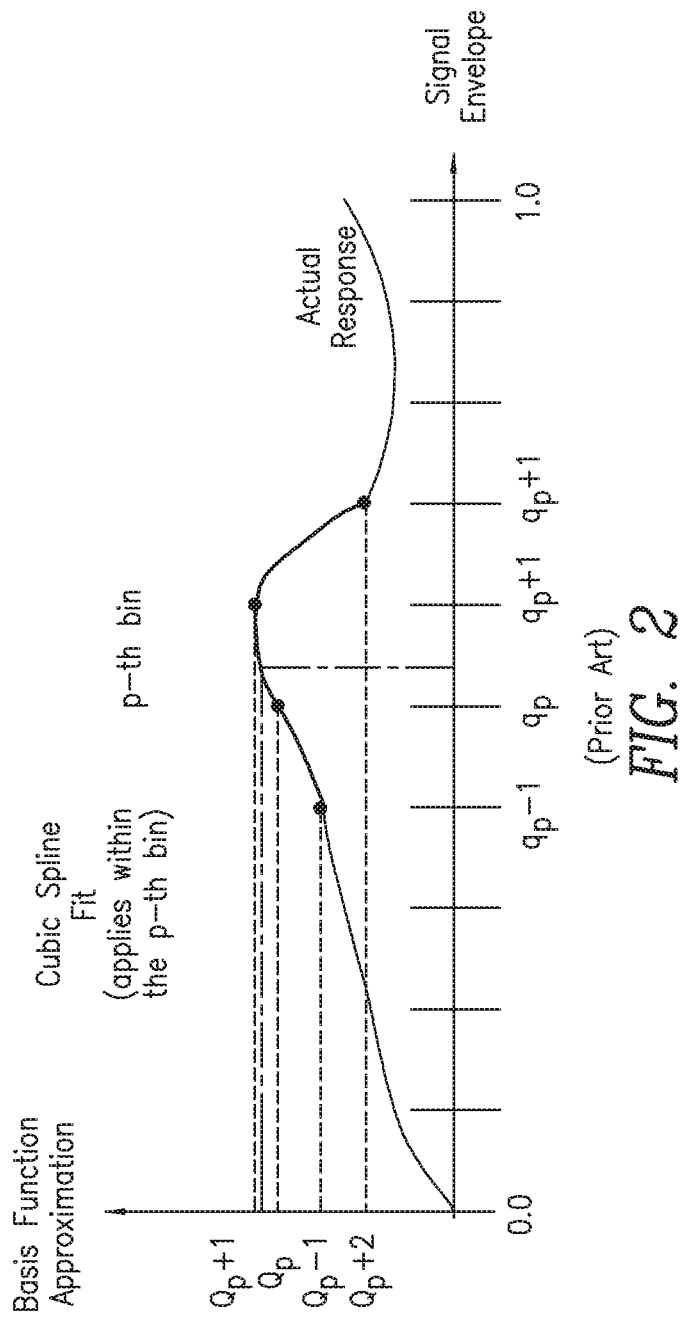
FIG. 2 is an illustration of curve-fitting using a cubic spline.
Figure 3:
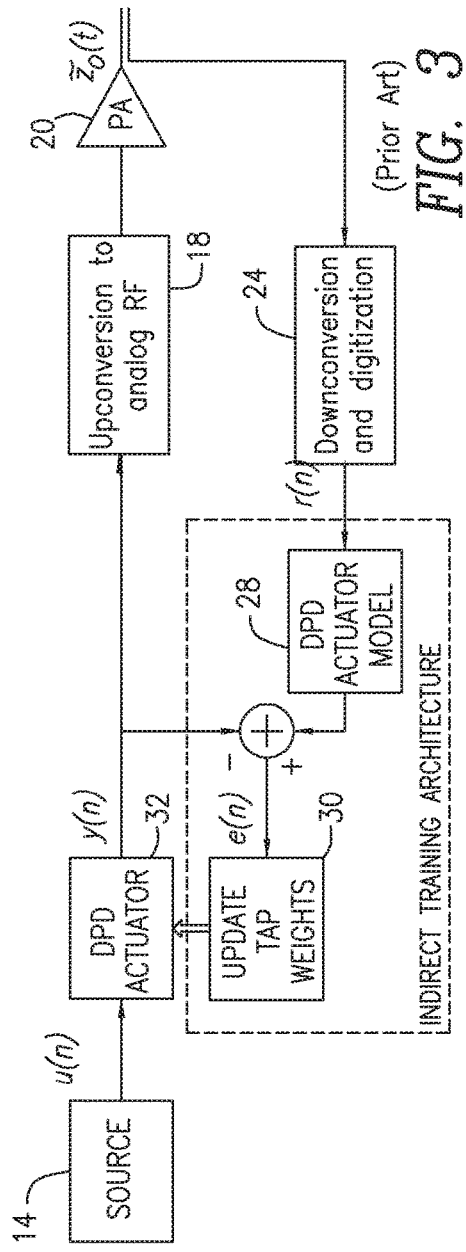
FIG. 3 is a block diagram of an indirect learning DPD system.
Figure 4:
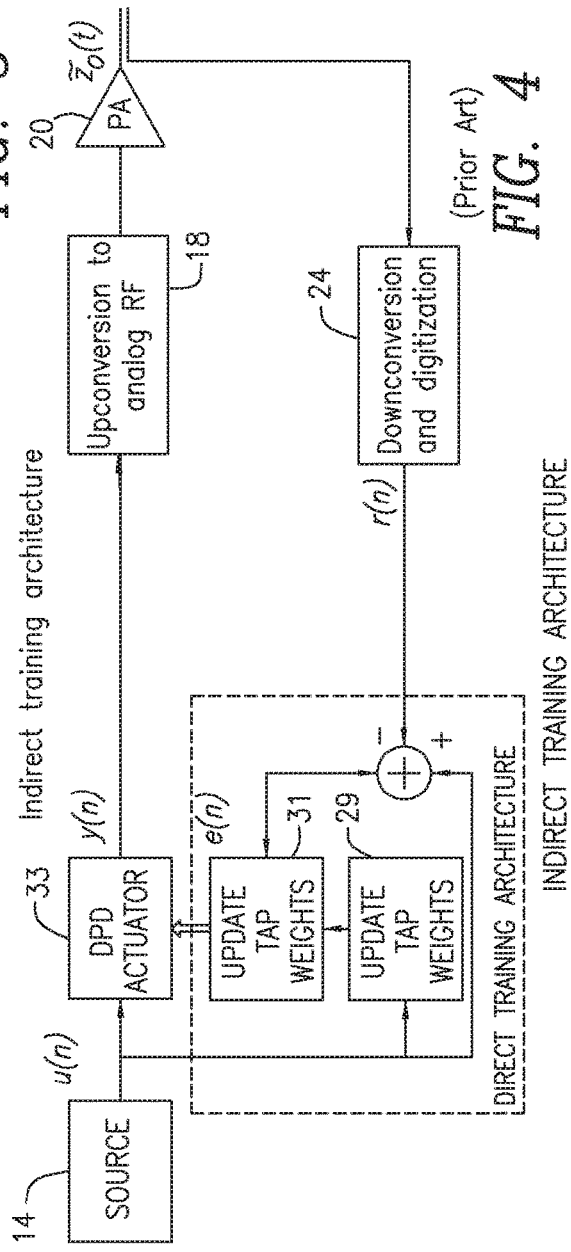
FIG. 4 is a block diagram of a direct learning DPD system.

Before describing in detail exemplary embodiments that are in accordance with the present disclosure, it is noted that the embodiments reside primarily in combinations of apparatus components and processing steps related to digital pre-distortion for pre-distorting a single or multi-band signal to be amplified by a non-linear power amplifier. Accordingly, the system and method components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Although terminology from 3GPP LTE has been used in this disclosure to describe some embodiments, this should not be seen as limiting the scope of the embodiments to only the aforementioned system. Other wireless systems, including not only WCDMA, WiMax, UMB and GSM, but also, other current or future 4G or 5G 3GPP networks, may also benefit from exploiting the subject matter covered within this disclosure. Note also, that although embodiments may be particularly suited for a power amplification system of a wireless communication system, application to other uses of power amplification systems is contemplated.

Embodiments described herein encompass a novel 2D-DPD architecture based on splines for digital pre-distortion of concurrent multi-band transmitters that provides effective linearization with low computational complexity, a high degree of flexibility for addressing a wide variety of PA's with a single architecture, and admits a low-cost closed-loop real-time adaptation of its tap coefficients. Further, embodiments described herein encompass a closed-loop algorithm to perform the initial acquisition of the tap weights for the spline-based concurrent dual-band DPD actuator, and to provide real-time adaptive tracking of the actuator weights for continuous operation in non-stationary conditions.

Some embodiments provide arrangements to implement practical low cost DPD for single band, concurrent dual-band and other multi-band systems while avoiding the drawbacks of GMP-based approaches such as the fixed-point difficulties and high cost of synthesizing high-order nonlinearities, and address the explosion in LUT depth and prohibitive LUT re-computation cost of schemes based on cubic splines.

In particular, some embodiments provide solutions to problems of known methods of digital pre-distortion. For example:

Some embodiments provide ways to avoid the issues of high-order nonlinearities by adopting a piecewise fit of well-behaved low-complexity basis functions to the PA output across the full dynamic range of the signal envelope. Some embodiments adopt a partitioning of the signal envelope into a number of bins that is similar in spirit to spline-based schemes, but differs in the mechanism of synthesizing each piecewise node fit for any given bin in order to reduce complexity of both the 1D and 2D distortion products.

Rather than explicit spline-based interpolation of the signal envelope using the surrounding neighborhood of knots, the disclosure applies a family of overlapping low-complexity basis functions to partition the signal envelope range into a number of (possibly unequal width) bins. A single basis function is assigned to each knot with span limited to the two neighboring knots such that the envelope value in any bin may be expressed as a weighted sum of basis functions assigned to the knots defined at the boundaries of that bin.

Some embodiments make use of quadratic spline functions as a preferred low-complexity solution, since they deliver continuity of 0th and 1st order derivatives at the knot boundaries required for modeling smooth functions, plus they admit a simple mathematical expression that is economical for direct implementation in hardware as opposed to the LUT pre-compute schemes often used in cubic splines.

At least two different strategies for combining the 1D spline fitting functions into 2D product formulation required to support concurrent dual-band DPD are described herein. A rectangular coordinate formulation is used to provide the best modeling accuracy while a polar coordinate alternative may be used to reduce the model complexity while exploiting the natural distribution of the joint signal envelope for wideband signals.

Some embodiments provide flexible and low-complexity mechanisms based on simple scaling and/or LUT-based pre-emphasis to account for the actual distribution of the joint envelope of the dual-band signals to maximize the modeling accuracy for a given number of signal bins, or alternately to reduce the complexity for a desired modeling accuracy.

Some embodiments provide a flexible architecture based on a shared front-end memoryless computation of the basis functions followed by a back-end network of tapped delay lines and multiplexing that introduces latency into the basis function outputs and allows a flexible set of time delay and time skew assignments between branches of the DPD actuator to enable linearization of a wide variety of PA topologies with a single DPD subsystem architecture.

Based on the low-cost architectures described herein that allow direct computation of the signal envelope "bin interpolation" in hardware, some embodiments support direct adaptation of tap weight parameters via suitably modified, low-cost closed-loop adaptive filter schemes yielding a much faster adaptation rate than can be achieved by conventional schemes using pre-computed cubic spline LUTs.

In this written description, basis functions are described that overcome problems of known basis functions, such as GMP basis functions and cubic splines as described above. Then, methods of implementing direct adaptation of tap weights via low-cost, closed-loop filter schemes will be described.

Basis functions $\{\psi_b\}$ constructed from overlapping splines provides a simple yet effective means to subdivide the dynamic range of the signal envelope $|u(n-m)|$ into a finite number of B−1 bins with boundaries defined by the set of B knots $\{b_0, b_1, \ldots, b_{B-1}\}$. The bin widths may be chosen to be identical or they may be spaced non-uniformly to account for a non-uniform distribution of signal envelope. In either case, an overlapping low-complexity spline function is assigned to each knot, and constructed in such a way that its value is unity at the knot position, and falls to zero at both of its two neighboring knots, and each pair of neighboring knot functions exhibit a continuous 1st order derivative at the knot boundaries where they meet.

Figure 5:
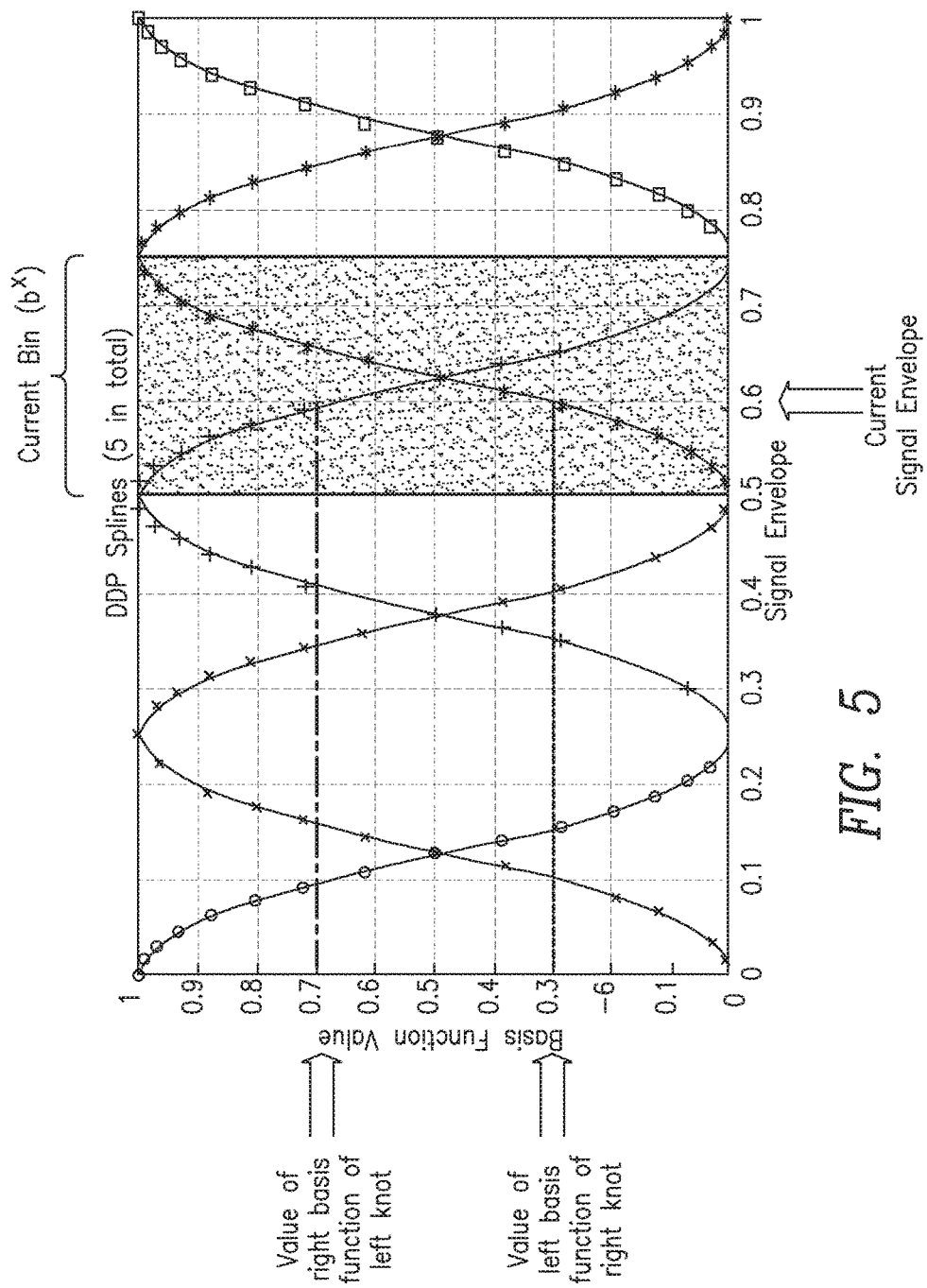
FIG. 5 is a graph of overlapping quadratic spline functions with equal-width bins.

This is shown in FIG. 5 for the case of B=5. Each spline function is a second order spline $\psi_{b,2}(a,u)$ given by Equation 6. The b-th spline is centered at the b-th knot where its value is unity, and it decays to zero at knot b−1 and knot b+1. The parameter a stretches the (normalized) spline so that it spans the width of two bins.

$$\psi_{b,2}(a, u) = \begin{cases} \frac{1}{2}\left(\frac{u}{a/2}\right)^2, & 0 \le u \le a/2 \\ 1 - \frac{1}{2}\left(\frac{u-a}{a/2}\right)^2, & a/2 \le u \le 3a/2 \\ \frac{1}{2}\left(\frac{2a-u}{a/2}\right)^2, & 3a/2 \le u \le 2a \end{cases} \quad \text{Equation 6}$$

For uniformly spaced knots, each spline is identical with the same a parameter. Knots with non-uniform spacing may be supported by the following extension to the above construction. Instead of a single spline assigned to each knot, we may alternately assign a pair of "left" and "right" half-splines to each knot with stretching parameters $a_L$ and $a_R$ chosen as required to cause each half-spline to decay to zero at the neighboring left and right knots, which may be located at different distances from the current knot due to the non-uniform spacing.

The actuator maintains a complex-valued weight $w_b(m)$ for each knot. These tap weights can be tuned actively by the Tap Weight Evaluation block 26 of FIG. 1 based on an appropriate closed-loop algorithm. By tuning the tap weights to the appropriate value, the DPD predistorter can linearize the PA.

Distortion products are produced using the above construction of overlapping splines using the set of stored tap weights $\{(w_b(m)\}$ as follows. The "active bin" is identified as the bin into which the current signal envelope value |u(n−m)| falls, shown as the shaded area or the $3^{rd}$ bin of FIG. 5. The active bin identifies the particular "right basis function" of the left-side knot and "left basis function" of the right-side knot that forms the boundary of the active bin. Defining the index of the left-side knot as b, the distortion product $w_b(m) \cdot \psi_{b,2}(a_R, a_R-z) + w_{b+1}(m) \cdot \psi_{b+1}(a_L, z)$ forms the "interpolated" contribution to the current signal envelope, as expressed by the offset z from the left-size knot). For illustration, FIG. 5 shows the $\psi_{b,2}(a_R, a_R-z)=0.7$ and $\psi_{b+1}(a_L,z)=0.3$ for a signal envelope of |u(n−m)|=0.6 (or equivalently z=0.1).

Alternative forms of overlapping splines may be chosen. For example, Equation 7 provides a normalized 3rd order spline that offers continuous 2nd order derivatives in exchange for an increase in its computational complexity. Interestingly, since these splines are not used strictly for interpolation there is very little difference observed between the 2nd and 3rd order splines provided a sufficient number of knots is used. For this reason, the 2nd order spline is preferred as it has the least computational complexity.

$$\psi_{b,3}(a, u) = \begin{cases} 2\left(\frac{a-x}{a}\right)^2 \cdot \left[\left(\frac{a-x}{a}\right) - \frac{3}{2}\right] + 1, & 0 \le u \le a \\ 2\left(\frac{x-a}{a}\right)^2 \cdot \left[\left(\frac{x-a}{a}\right) - \frac{3}{2}\right] + 1, & a \le u \le 2a \end{cases} \quad \text{Equation 7}$$

A number of hardware optimizations may be performed to reduce the computational complexity required to evaluate the left and right spline functions based on Equation 6. One possible architecture involves pre-computation and storage in a lookup table of the distortion term $w_b(m) \cdot \psi_{b,2}(a_R, a_R-z) + w_{b+1}(m) \cdot \psi_{b+1}(a_L, z)$ as a function of the quantized signal envelope offset z. This provides an economical actuator since the operation then consists of a single table lookup. However, the LUT size may become prohibitive since a large resolution (typically 12 bits or higher) is required for z. Also, the LUT depth may become prohibitive in the dual-band case, where the index grows to 24 or more bits. Also, tap weight adaptation may be costly since separate circuitry must be allocated to update the tap weights $\{w_b(m)\}$ directly, and then additional circuitry must be used to re-compute the LUT contents for each z value every time the tap weights change.

The spline functions of Equation 6 are selected to be low-cost to enable direct computation in hardware. This helps keep the LUT size much smaller since then only the tap weights $\{w_b(m)\}$ must be stored, and their depth varies only by the number of knots B, which will be a few tens in number for most cases in practice. Further cost savings can be obtained in evaluating $\psi_{b,2}(\cdot)$ and $\psi_{b+1,2}(\cdot)$ in certain cases:

For uniformly spaced knots, $\psi_{b+1,2}(\cdot)=1-\psi_{b,2}(\cdot)$ due to the symmetric construction of the pulses, and so only one of the two overlapping basis functions needs to be evaluated explicitly in this case.

When the number of bins $B-1=2^C$ for some integer C is a power of two, then computation of the bin index to which the signal envelope belongs may be obtained by simple "bus ripping," so the basis function in Equation 6 may be computed with fewer bits than the input signal envelope resolution.

Figure 6:
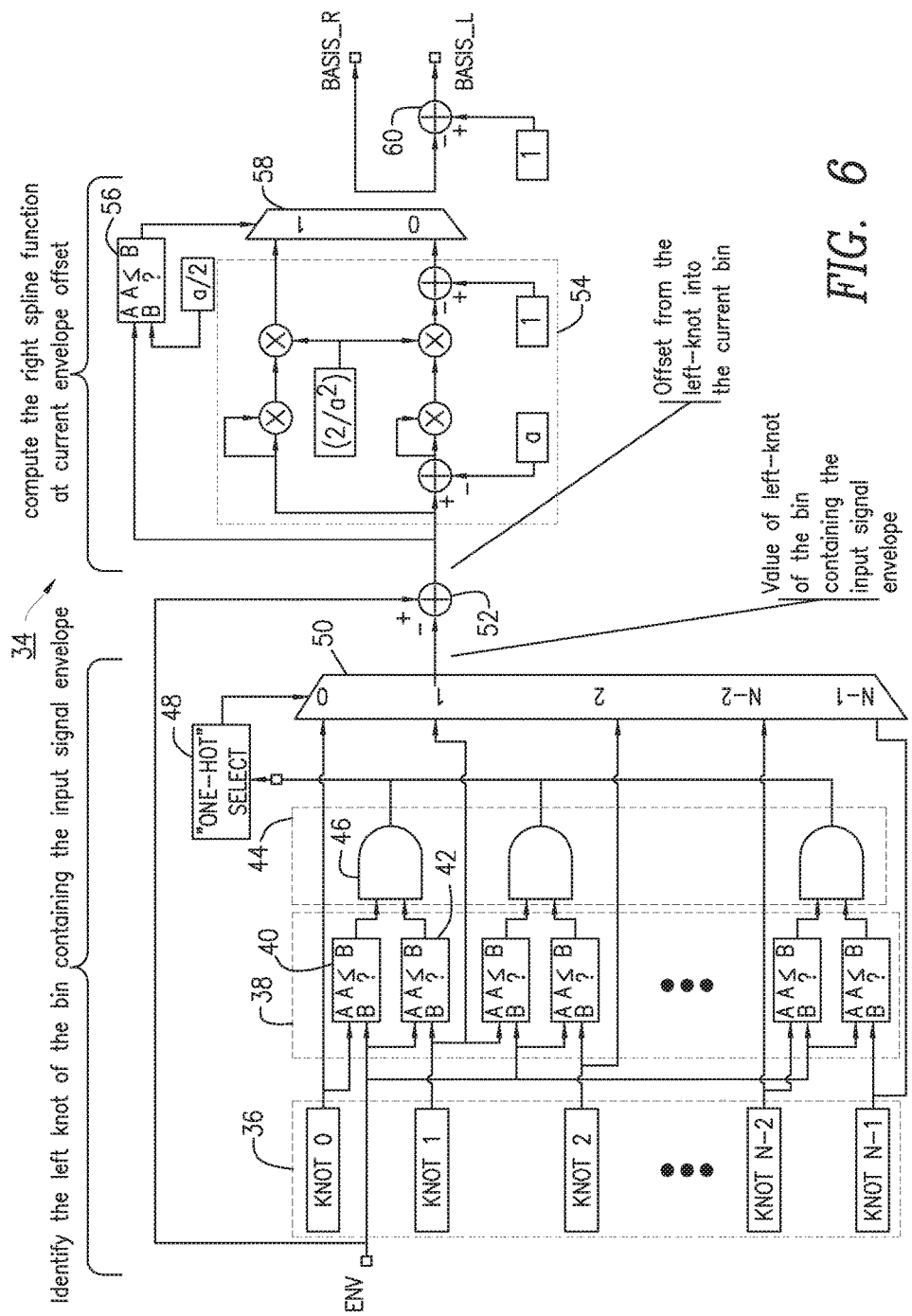
FIG. 6 is block diagram of a circuit for computing second order splines.

FIG. 6 is a block diagram of an exemplary circuit for computing second order splines of Equation 6. The circuit of FIG. 6 includes memory bank 36 which stores the values of the knots 0 through N−1. The knot values from the memory 36 are input to a bank 38 of comparators 40 and 42. Another input to the comparators 40 and 42 is the signal envelope |u(n−m)|. The function of the comparators 40 and 42 are to choose the lesser of the knot value and the signal envelope value in order to determine the left knot of the current bin and the offset from the left knot at which the signal envelope is evaluated. The output of the comparators 40 and 42 are input to each of a bank 44 of AND gates 46 which output the logical AND of the outputs of comparators 40 and 42. The output of the AND gates is input to a "one hot" selector 48 which outputs a signal to a multiplexer 50. Although only one line is shown connecting the AND gates to the selector 48, actually there is a separate line from each AND gate output to the selector 48, so that the line connecting the AND gate outputs to the selector 48 is a bus. The output of the multiplexer 50 is a value of the left knot of the bin containing the input signal envelope. This value is subtracted from the signal envelope at a subtractor 52 to produce an offset from the left knot into the current bin.

The output of the subtractor 52 is input to a multiplier/adder unit 54, which contain the multipliers and subtractors to compute the terms of Equation 6. The output of the subtractor 52 is also input to a comparator 56 which to determine which interval of the basis function of FIG. 6 is being defined. The outputs of the multiplier/adder unit 54 are input to a multiplexer 58 which is controlled by the output of the comparator 56 to output the right spline function value. The left spline is computed at the subtractor 60.

A single-band DPD actuator may be formulated using the overlapping splines as shown in Equation 8 and outlined as follows:

A "time skew" parameter v is introduced in Equation 8, as is done using the GMP formulation, to provide a flexible mechanism for including different forms of distortion products as would be included in a more general Volterra representation, while still maintaining the regular structure of the memory polynomial. Assigning different time skews between the signal u(n−m) and envelope |u(n−m−v)| provides this flexibility.

The quadratic splines $\psi_{b^*}(|u(n-m-v)|)$ and $\psi_{b^*+1}(|u(n-m-v)|)$ are evaluated as outlined above as a function of the signal envelope. A total of B knots are defined over the full dynamic range on (0,1). The envelope |u(n−m−v)| will land in only one of the B−1 bins, hereafter referred to as index b*. By construction, only $\psi_{b^*}(\bullet)$ and $\psi_{b^*+1}(\bullet)$ will have a non-zero contribution to the output y(n). The result is the simplification of Equation 8 with no summation over index b. Only two tap weights contribute to each delayed (and/or skew).

$$y(n) = \sum_{m=0}^{M} \sum_{v=-V}^{+V} \begin{bmatrix} w_{b^*}(m,v) \cdot \psi_{b^*}(|u(n-m-v)|) + \\ w_{b^*+1}(m,v) \cdot \psi_{b^*+1}(|u(n-m-v)|) \end{bmatrix} \cdot u(n-m) \quad \text{Equation 8}$$

Due to the large peak-to-average ratios of wideband LTE signals, typically only a small portion of the available signal envelope dynamic range is occupied. As a result, the construction of overlapping quadratic splines shown in FIG. 5 will be underutilized significantly; only a small fraction of the available knots, and their associated complex-valued tap weights $\{w_b(m)\}$, will be used to pre-distort the signal since most of the signal envelop dynamic range is not used. Two different schemes to address this are shown in FIGS. 7 and 8.

Figure 7:
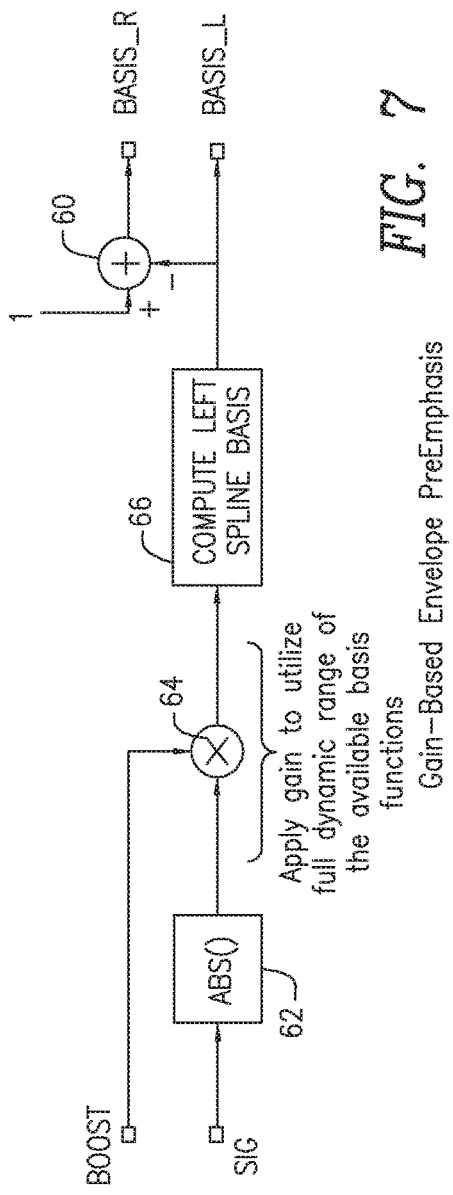
FIG. 7 is a block diagram of a circuit for gain based pre-emphasis.

Gain-based signal envelop pre-emphasis, as shown in FIG. 7, involves multiplying the signal by a fixed constant γ to scale the signal envelope before computing its basis functions. Thus, the envelope of the input signal is determined at block 62. This envelope is multiplied at multiplier 64 by γ and input to a left spline basis function calculator 66. The right spline is computed at the subtractor 60. Consequently, distortion terms are evaluated using $\psi_{b^*}(\gamma \cdot |u(n-m-v)|)$ and $\psi_{b^*+1}(\gamma \cdot |u(n-m-v)|)$. This gain boost serves to excite a wider portion of the available signal envelope dynamic range, leading to a wider subset of the tap weights $\{w_b(m)\}$ being excited by the DPD subsystem. As a consequence, the DPD modeling capability is improved significantly. Note that this boost gain γ does not impact the data path in any way; it simply changes the active bin index b* that is excited by a particular value of the signal envelope.

Thus, in some embodiments, for each band, the method includes scaling the signal envelope and computing the spline function as a function of one of the scaled signal envelope and a delayed scaled signal envelope.

Figure 8:
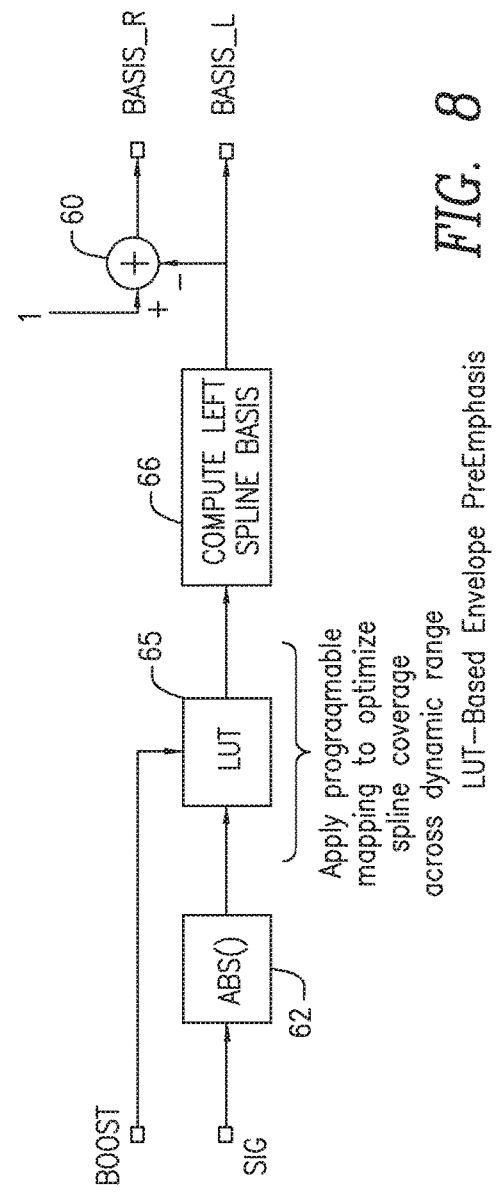
FIG. 8 is a block diagram of a circuit for look-up table based pre-emphasis.

Further sophistication in the modeling capability may be achieved by replacing the gain-based pre-emphasis with a LUT 65, as shown in FIG. 8 that introduces a programmable mapping between the observed signal envelope and that used to excite the overlapping quadratic splines. Instead of a fixed-gain γ, the LUT changes the distortion such that $\psi_{b^*}(\gamma(z))$ and $\psi_{b^*+1}(\gamma(z))$ is computed instead, where z=|u(n−m)| is the signal envelope and γ(z) is some injective mapping function of the signal envelope.

One possible use of the LUT 65 is to equalize the probability that each bin is excited so that all of the available tap weights $\{w_b(m)\}$ have an equal and uniform probability of being incorporated in the predistortion model. This may be effected by using a mapping γ(z)=F(z), where z=|u(n)| is the signal envelope itself and F(z) is its cumulative distribution function of the envelope.

Figure 9C:
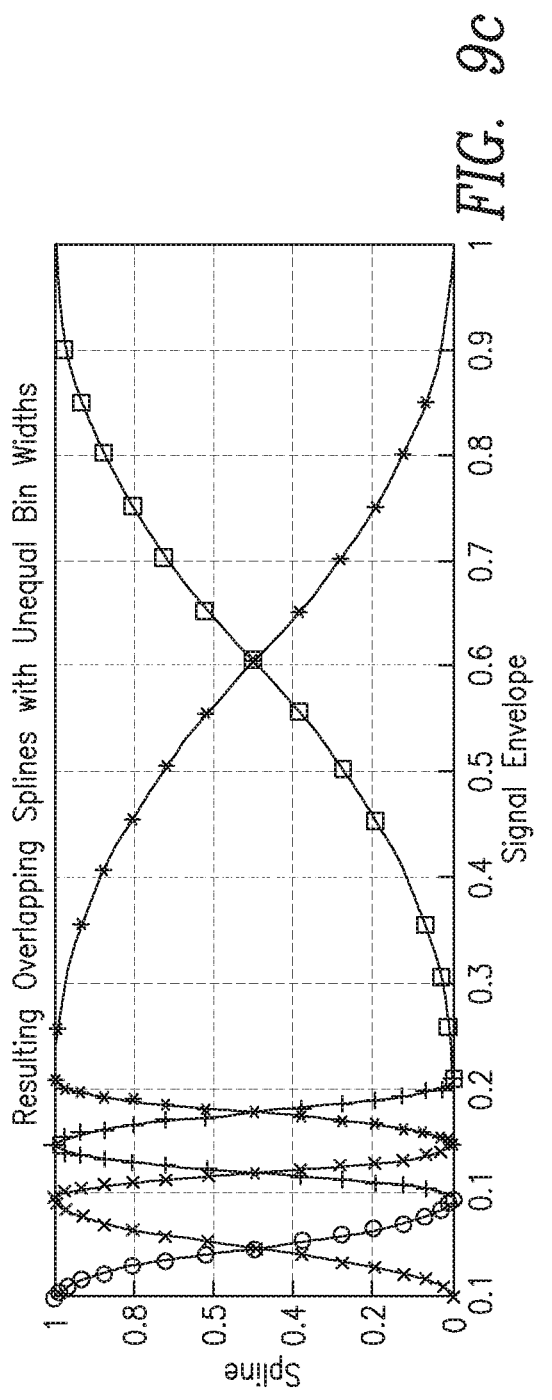

FIG. 9 shows the effect of equal-probability LUT-based envelope pre-emphasis for the case of a single-band LTE signal assuming B=5 overlapping quadratic splines are used as basis functions. The top plot, a) shows the estimated probability density function (PDF) of a wideband LTE signal. The middle plot, b) shows the estimated cumulative distribution function (CDF) which may be used as the LUT function γ(z)=F(z). The bottom plot, c) shows the effect of the LUT on the overlapping basis functions—the impact of the LUT is to implement overlapping basis functions with non-uniform knot spacing in order to achieve the equal probability use of each tap weight in the model. This may be compared with the uniform knot spacing of FIG. 5.

Thus, in some embodiments, for each band, the method includes inputting the signal envelope to a pre-emphasis unit that maps each value of the signal envelope to a scaled value of the signal envelope. In some embodiments, the mapping is based on cumulative distribution function of the signal envelope.

The overlapping quadratic splines described above may be extended to support pre-distortion of concurrent multi-band signals. Two distinct forms are considered: a rectangular form and a polar form. In the rectangular form, the dual-band basis functions are extended in a straightforward manner from the single-band case. First, two sets of overlapping quadratic splines are defined; one for each band. Each set of splines is defined as outlined for the single-band case described above. A set of $B_L$ knots is defined for the lower band, and a second set of $B_U$ knots is defined for the upper band. In general, the process of this disclosure does not require $B_L \neq B_U$ although this will be assumed hereafter for simplicity of discussion. As in the signal-band case, only two neighboring overlapping splines will be excited for any given signal envelope observed in each band.

Let bins b* and b*+1 represent the two knots excited for the lower band, and let d* and d*+1 represent the two knots excited for the upper band.

It follows from the discussion above with respect to the single band case that "intra-band" distortion may be synthesized for the lower band from distortion products $w_{L,b^*}(m,v) \cdot \psi_{L,b^*}(|u_L(n-m-v)|)$ and $w_{L,b^*+1}(m,v) \cdot \psi_{L,b^*+1}(|u_L(n-m-v)|)$. Similarly, $w_{U,d^*}(m,v) \cdot \psi_{d^*}(|u_U(n-m-v)|)$ and $w_{U,d^*+1}(m,v) \cdot \psi_{U,d^*+1}(|u_U(n-m-v)|)$. Here, $\{w_{L,b}(m,v)\}$ represent the complex-valued tap weights for the lower band, and $\{w_{U,d}(m,v)\}$ represent the complex-valued tap weights for the upper band.

"Inter-band" or "cross-term" distortion must also be included for successful pre-distortion of concurrent dual-band transmitters. Cross-terms may be synthesized directly for each band by acknowledging that a total of four cross-terms may be formed from the same two pairs of non-zero overlapping splines used to model the "intra-band" distortion in each band. These four products are shown together in Equation 9.

$$\psi_{L,b^*}(|u_L(n-m-v)|) \cdot \psi_{U,d^*}(|u_U(n-m-v)|)$$

$$\psi_{L,b^*+1}(|u_L(n-m-v)|) \cdot \psi_{U,d^*}(|u_U(n-m-v)|)$$

$$\psi_{L,b^*}(|u_L(n-m-v)|) \cdot \psi_{U,d^*+1}(|u_U(n-m-v)|)$$

$$\psi_{L,b^*+1}(|u_L(n-m-v)|) \cdot \psi_{U,d^*+1}(|u_U(n-m-v)|) \quad \text{Equation 9}$$

Distinct distortion products for each band may be generated based on the four basis function products in Equation 9 by assigning a distinct "cross-term" weight for each band, and by scaling the distortion product by the desired signal term ($u_L(n-m-v)$ or $u_U(n-m-v)$) for that band. The resulting dual-band DPD actuator that includes both the "intra-band" and "inter-band" distortion products is described by Equation 10 for the lower band and by Equation 11 for the upper band. Extensions for more than two bands follows in a straightforward and analogous manner.

Different numbers of knots for the upper and lower bands may be desirable for improved performance at the cost of greater complexity. Assuming $B_L = B_U \equiv B$ knots are assigned to each band, the "intra-band" or "thru" tap weight sets $\{w_{L,b}(m,v)\}$ and $\{w_{U,d}(m,v)\}$ will each contain B distinct taps. The "inter-band" or "cross" tap weight sets $\{x_{L,b,d}(m,v)\}$ and $\{x_{U,b,d}(m,v)\}$ will each contain $B \times B = B^2$ tap weights since those terms are formed as cross products of the "thru" basis functions. In the case where $B_L \neq B_U$, the total number of "cross" tap weights is $B_L \times B_U$ in each band. In a typical hardware implementation, the cross term tap weight index $i = b \times B_U + d$ is computed based on the "thru" tap weight indices b and d (which for $B_L = B_U \equiv B$ may simply be formed as a bit concatenation of the binary addresses used for b and d).

$$y_L(n) = \quad \text{Equation 10}$$

$$\sum_{m=0}^{M} \sum_{v=-V}^{+V} \left[ \begin{array}{l} w_{L,b^*}(m,v) \cdot \psi_{L,b^*}(|u_L(n-m-v)|) + \\ w_{L,b^*+1}(m,v) \cdot \psi_{L,b^*+1}(|u_L(n-m-v)|) \end{array} \right].$$

$$u_L(n-m) +$$

$$\sum_{m=0}^{M} \sum_{v=-V}^{+V} \frac{x_{L,b^*,d^*}(m,v) \cdot \psi_{L,b^*}(|u_L(n-m-v)|) \cdot}{\psi_{U,d^*}(|u_U(n-m-v)|) \cdot u_L(n-m)} +$$

$$\sum_{m=0}^{M} \sum_{v=-V}^{+V} \frac{x_{L,b^*,d^*+1}(m,v) \cdot \psi_{L,b^*}(|u_L(n-m-v)|) \cdot}{\psi_{U,d^*+1}(|u_U(n-m-v)|) \cdot u_L(n-m)} +$$

$$\sum_{m=0}^{M} \prod_{v=-V}^{+V} \frac{x_{L,b^*+1,d^*}(m,v) \cdot \psi_{L,b^*+1}(|u_L(n-m-v)|) \cdot}{\psi_{U,d^*}(|u_U(n-m-v)|) \cdot u_L(n-m)} +$$

$$\sum_{m=0}^{M} \sum_{v=-V}^{+V} \frac{x_{L,b^*+1,d^*+1}(m,v) \cdot \psi_{L,b^*+1}(|u_L(n-m-v)|) \cdot}{\psi_{L,d^*+1}(|u_U(n-m-v)|) \cdot u_L(n-m)}$$

$$y_U(n) = \quad \text{Equation 11}$$

$$\sum_{m=0}^{M} \sum_{v=-V}^{+V} \left[ \begin{array}{l} w_{U,d^*}(m,v) \cdot \psi_{U,b^*}(|u_U(n-m-v)|) + \\ w_{U,d^*+1}(m,v) \cdot \psi_{U,d^*+1}(|u_U(n-m-v)|) \end{array} \right].$$

$$u_U(n-m) +$$

$$\sum_{m=0}^{M} \sum_{v=-V}^{+V} \frac{x_{U,b^*,d^*}(m,v) \cdot \psi_{L,b^*}(|u_L(n-m-v)|) \cdot}{\psi_{U,d^*}(|u_U(n-m-v)|) \cdot u_U(n-m)} +$$

$$\sum_{m=0}^{M} \sum_{v=-V}^{+V} \frac{x_{U,b^*,d^*+1}(m,v) \cdot \psi_{L,b^*}(|u_L(n-m-v)|) \cdot}{\psi_{U,d^*+1}(|u_U(n-m-v)|) \cdot u_U(n-m)} +$$

$$\sum_{m=0}^{M} \prod_{v=-V}^{+V} \frac{x_{U,b^*+1,d^*}(m,v) \cdot \psi_{L,b^*+1}(|u_L(n-m-v)|) \cdot}{\psi_{U,d^*}(|u_U(n-m-v)|) \cdot u_U(n-m)} +$$

$$\sum_{m=0}^{M} \sum_{v=-V}^{+V} \frac{x_{U,b^*+1,d^*+1}(m,v) \cdot \psi_{L,b^*+1}(|u_L(n-m-v)|) \cdot}{\psi_{U,d^*+1}(|u_U(n-m-v)|) \cdot u_U(n-m)}$$

Figure 10:
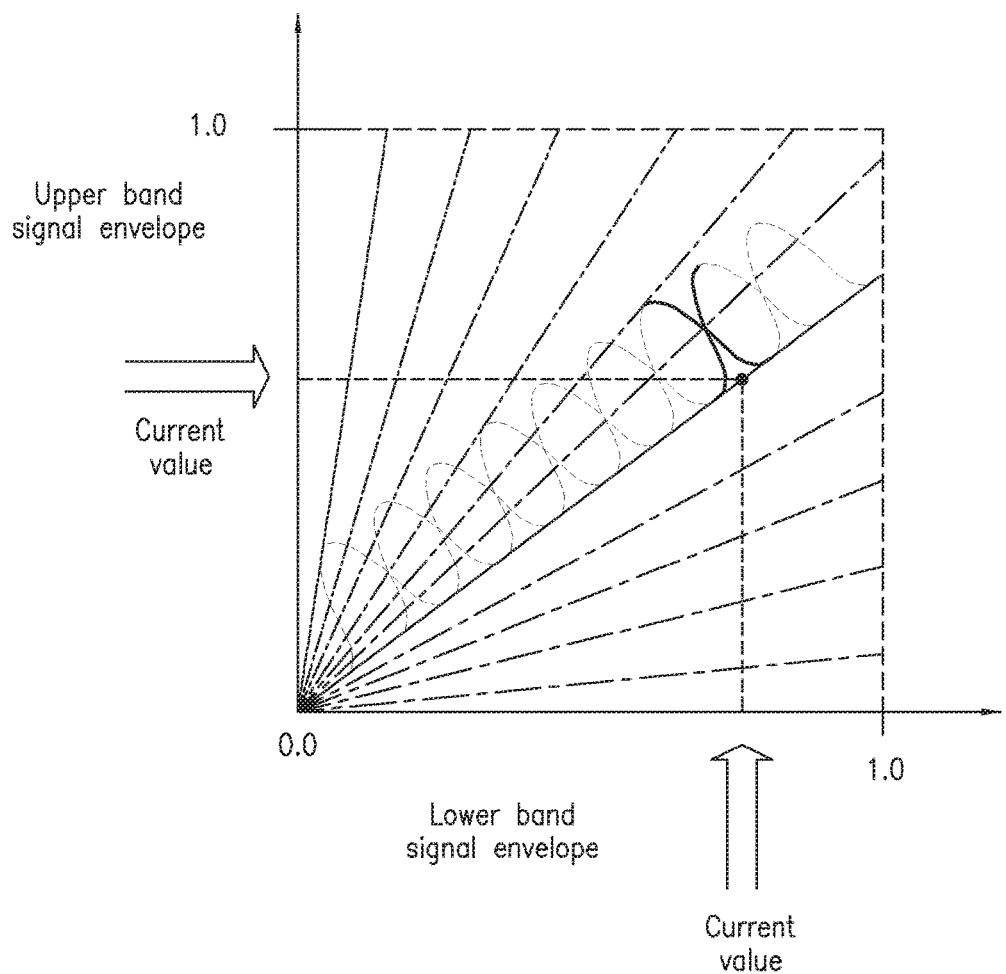
FIG. 10 is a graph of dual band basis functions plotted in polar coordinates.

The extension of the single-band DPD using overlapping splines to the dual-band case follows a straightforward extension of the 1D case to the 2D case using a "rectangular coordinate" construction. Now, consider the signal envelope in each band defining a single coordinate in an orthonormal basis. A set of overlapping splines is defined along the X dimension for the lower band, and a second set is defined along the Y dimension for the upper band. The lower band signal envelope is used to index the splines in the X dimension, whereas the upper band signal envelope indexes the splines in the Y dimension. This leads to an alternate formulation based on polar coordinates as shown in FIG. 10. The dual-band signal envelope $|u_L(n)| + j|u_U(n)| = R(n) \cdot \exp(j \cdot \theta(n))$ may be expressed as a polar magnitude $R(n)$ and phase rotation $\theta(n)$. A single set of overlapping splines may be defined for $R(n)$ using the construction proposed above with respect to Equation 6, to produce the cross-term distortion based on a single set of cross-term weights $\{x_{L,r^*,\theta^*}(m,v)\}$ and $\{x_{U,r^*,\theta^*}(m,v)\}$ for each band and indexed by the active radial splines $r^*$ and $r^*+1$ and the active quantized rotation $\theta^*$.

Thus, in some embodiments, when there are a plurality of bands, the method includes forming inter-band polar spline functions having a magnitude and phase based on the signal envelopes of the plurality of bands; and multiplying the inter-band polar spline functions at each of a plurality of radial knots by a respective tap weight at each knot; and wherein generating the pre-distorted signal includes adding a sum of tap-weighted polar spline functions to the sum of tap-weighted products.

Equations 12 and 13 provide the DPD actuator based on a polar formulation for the lower and upper bands, respectively. Note that both bands use the same expressions for the "thru" distortion terms in both rectangular and polar forms. The polar form provides a reduction in computational complexity as compared to the rectangular form. Extension of the polar formulation to >2 bands follows in a straightforward and analogous manner i.e., spherical coordinates for 3 bands, etc.

$$y_L(n) = \qquad \text{Equation 12}$$

$$\sum_{m=0}^{M} \sum_{v=-V}^{+V} \begin{bmatrix} w_{L,b^*}(m,v) \cdot \psi_{L,b^*}(|u_L(n-m-v)|) + \\ w_{L,b^*+1}(m,v) \cdot \psi_{L,b^*+1}(|u_L(n-m-v)|) \end{bmatrix}.$$

$$u_L(n-m) +$$

$$\sum_{m=0}^{M} \sum_{v=-V}^{+V} x_{L,r^*,\theta^*}(m,v) \cdot \psi_{R,r^*}(R(n-m-v)) \cdot u_L(n-m) +$$

$$\sum_{m=0}^{M} \sum_{v=-V}^{+V} x_{L,r^*+1,\theta^*}(m,v) \cdot \psi_{R,r^*+1}(R(n-m-v)) \cdot u_L(n-m)$$

$$y_U(n) = \qquad \text{Equation 13}$$

$$\sum_{m=0}^{M} \sum_{v=-V}^{+V} \begin{bmatrix} w_{U,d^*}(m,v) \cdot \psi_{U,b^*}(|u_U(n-m-v)|) + \\ w_{U,d^*+1}(m,v) \cdot \psi_{U,d^*+1}(|u_U(n-m-v)|) \end{bmatrix}.$$

$$u_U(n-m) +$$

$$\sum_{m=0}^{M} \sum_{v=-V}^{+V} x_{U,r^*,\theta^*}(m,v) \cdot \psi_{R,r^*}(R(n-m-v)) \cdot u_U(n-m) +$$

$$\sum_{m=0}^{M} \sum_{v=-V}^{+V} x_{U,r^*+1,\theta^*}(m,v) \cdot$$

$$\psi_{R,r^*+1}(R(n-m-v)) \cdot u_U(n-m)$$

The concepts of signal envelope pre-emphasis presented above for the single band case may be extended in a straightforward manner to the dual band case. In particular:

Gain-based or LUT-based pre-emphasis may be applied independently to each band in the rectangular dual-band DPD approach. Different gain factors may be used based on the peak-to-average ratio (or other signal statistics of interest) in each band. Similarly, different LUT tables may be used to equalize the bin probabilities based on presence of signals with different envelope distributions in each band.

Gain-based or LUT-based pre-emphasis may also be applied to the splines in the radial direction of the polar coordinate system to improve performance and modeling capability in a manner similar to the rectangular case using an identical approach.

Some embodiments provide a robust and flexible framework for single-band, dual-band and multi-band distortion synthesis where the basis function selection, bin and knot assignment, and signal envelope scaling and/or pre-emphasis may all be selected as appropriate to maximize modeling capability and performance or to tune computational complexity to meet desired implementation requirements. Only the rectangular form is presented hereafter for the sake of brevity.

Figure 11:
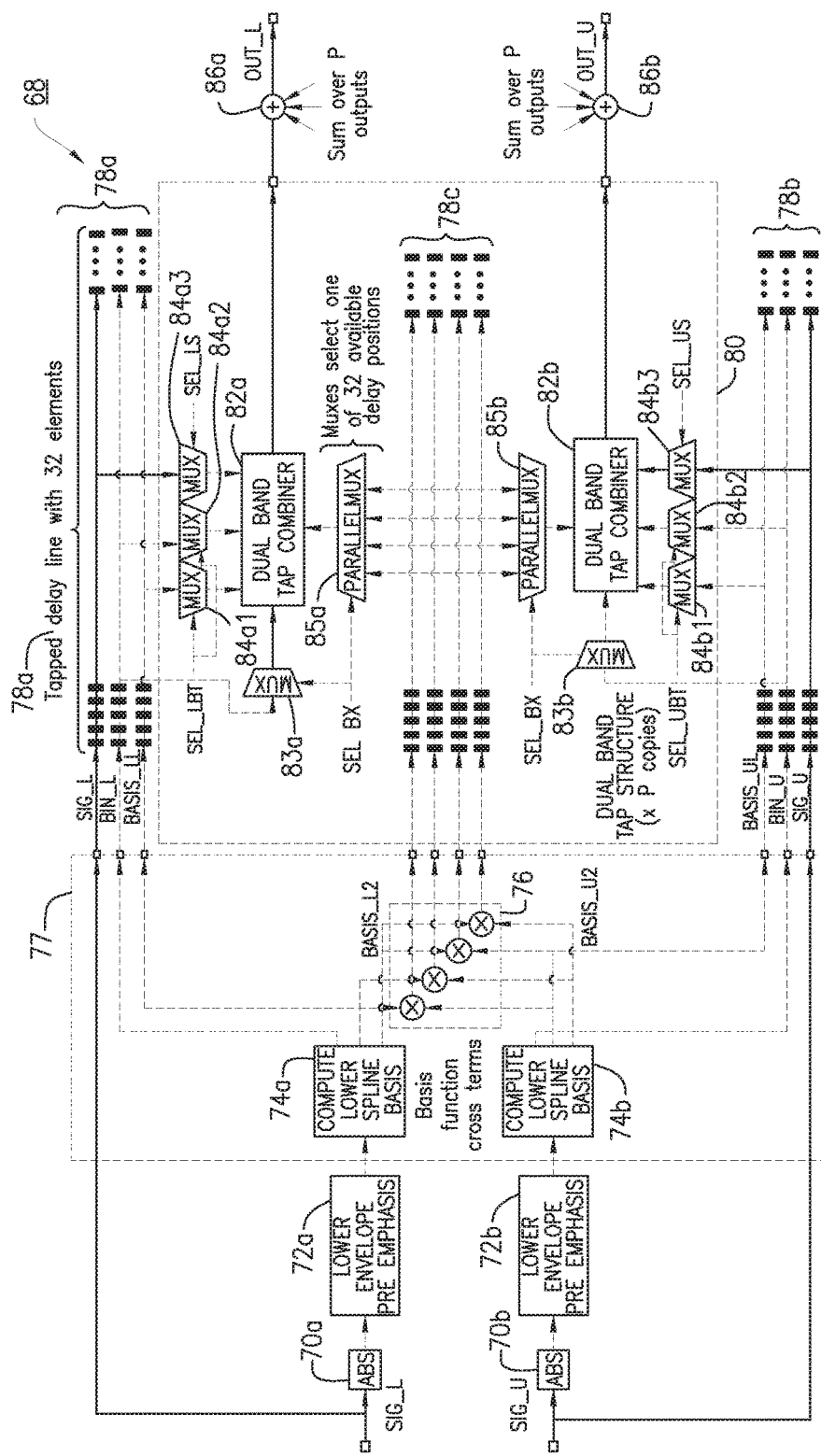
FIG. 11 is a block diagram of a DPD actuator.

FIG. 11 is a block diagram of an exemplary DPD actuator 68. Complex-valued signals are denoted using solid lines, whereas real-valued signals are denoted using dotted lines. The actuator includes the following components:

Dual Coordinate Rotation Digital Computers (CORDICs) 70a and 70b—a pair of vectoring CORDICs (denoted by "ABS" in FIG. 11) compute the signal envelope values $|u_L(n)|$ and $|u_U(n)|$ for the lower and upper bands, respectively.

Envelope Pre-Emphasis 72a and 72b-performs a "gain boost" or LUT-based pre-emphasis of the signal envelope independently for each band as discussed above in order to maximize fully the excitation of the tap weights available for pre-distortion.

Dual-band Spline Basis Computation 74a and 74b-computes the lower band "thru" overlapped splines $\psi_{L,b^*}(|u_L(n)|)$ and $\psi_{L,b^*+1}(|u_L(n)|)$ based on the current active bin b*, the upper band "thru" overlapped splines $\psi_{U,d^*}(|u_U(n)|)$ and $\psi_{U,d^*+1}(|u_U(n)|)$ based on the current active bin d*, and the set of four "cross" rectangular distortion products shown in Equation 9. The structure is memoryless and generates all outputs for a particular sample time n (i.e. time delay parameter m and time skew parameter v of Equation 9Error! Reference source not found. are both zero). For simplicity, the structure assumes $B_L = B_U = B$ knots are assigned in each band. In practice, typically B=16 provides sufficient performance.

The lower band "thru" outputs consist of the complex-valued lower band signal $u_L(n)$, the real-valued lower band basis function $\psi_{L,b^*}(|u_L(n)|)$, and its corresponding bin index b*. These are referred to as "SIG_L", "BASIS_LL", and "BIN_L", respectively FIG. 11. The second spline $\psi_{L,b^*+1}(|u_L(n)|)=1-\psi_{L,b^*}(|u(n)|)$, is not produced as an output here as it is much cheaper to re-compute it downstream than to incur the cost of delay lines and multiplexing.

The upper band "thru" outputs consist of the complex-valued lower band signal $u_U(n)$, the real-valued lower band basis function $\psi_{U,d^*}(|u_U(n)|)$, and its corresponding bin index d*. These are referred to as "SIG_U", "BASIS_UL", and "BIN_U", respectively, in FIG. 11.

The common "cross" outputs consist of the four rectangular distortion products $\psi_{L,b^*}(|u_L(n)|) \cdot \psi_{U,d^*}(|u_U(n)|)$, $\psi_{L,b^*+1}(|u_L(n)|) \cdot \psi_{U,d^*}(|u_U(n)|)$, $\psi_{L,b^*}(|u_L(n)|) \cdot \psi_{U,d^*+1}(|u_U(n)|)$, and $\psi_{L,b^*+1}(|u_L(n)|) \cdot \psi_{U,d^*+1}(|u_U(n)|)$ from Equation 9. These are multiplied in multipliers 76, to provide the distortion products.

Tapped Delay Lines 78a, 78b and 78c-introduce latency into the basis function outputs so that a flexible set of delay and skew assignments, represented by indices m and v respectively in Equation 10 and Equation 11, may be made to each tap weight function with minimal computational complexity.

The maximum span of the delay lines must be selected in practice to exceed the worst-case delay anticipated for the PA undergoing predistortion. FIG. 11 shows a value of 32 which leads to acceptable multiplexing cost. Based on this choice, the architecture can achieve memory depths (indexed by m with a maximum given by M in Equation 10 and Equation 11) approaching M=31. It is understood, however, that implementation is not limited to 32 delay lines.

This maximum delay line span also establishes the maximum time-skew, indexed by v to a maximum of V in Equation 10 and Equation 11. The architecture allows one to introduce skew between the various terms involved in the actuator by simply setting the multiplexing controls as desired to pick off the desired inputs from the tapped delay line. As an example, the multiplexing controls could be set specifically to select the terms $u_L(n-1)$, $\psi_{L,b^*}(|u_L(n-3)|)$, and $\psi_{L,b^*}(|u_L(n-4)|)$. $\psi_{U,d^*+1}(|u_U(n-4)|)$ for input to the downstream dual-band tap weight structures for subsequent processing.

Dual-Band Tap Structures 80—lookup the appropriate complex-valued tap weights based on the input envelope bin indices, multiply the input basis functions by these tap weights, and perform the combining of their outputs as dictated in Equation 10 and Equation 11.

The dual band tap combiner 82a performs "thru" operations for the lower band based on inputs $u_L(n)$, $\psi_{L,b*}(|u_L(n)|)$, and b*. The input $\psi_{L,b*+1}(|u_L(n)|)=1-\psi_{L,b*}(|u_L(n)|)$ is re-computed internally rather than having this input provided by an additional delay line. A second "thru" combiner 82b performs similar operations for the upper band based its inputs.

The combiners 82a and 82b perform "cross" operations to generate inter-band distortion for the lower band by multiplying the four rectangular distortion products of Equation 9 with complex-valued tap weights obtained via table lookup using the product of the two signal envelope bin indices as the input address. A second "cross" combiner generates inter-band distortion for the upper band in a similar manner.

Parallel multiplexing by multiplexers 84a1, 84a2, 84a3, 84b1, 84b2, 84b3 and 85a and 85b of the inputs for both "thru" and "cross" combiners supports a flexible assignment of tap delay and skew since the particular select lines may be configured via software for each tap:

Use "SEL_LS" of multiplexer 84a3 to select a tap delay assignment for $u_L(n)$ for the lower "thru" and "cross" combiners. Using the same signal sample for all envelope combinations reduces multipliers since the envelope contributions may be pre-summed prior to multiplying $u_L(n)$ (see Equation 10). Similarly, use "SEL_US" of the multiplexer 84b3 for the upper "thru" and "cross" combiners.

Use "SEL_LBT" of the multiplexers 84a1 and 84a2 to select a joint tap delay assignment for $\psi_{L,b*}(|u_L(n)|)$, and b* for the lower "thru" combiner. These controls may be used set to a different tapped delay line setting, thus introducing a time skew between, for example, $u_L(n)$ and $\psi_{L,b*}(|u_L(n-v)|)$. Similarly, use "SEL_UBT" of the multiplexers 84b1 and 84b2 for the upper "thru" combiner.

Use "SEL_BX" of the multiplexer 85a to select a joint tap delay assignment for the four rectangular distortion products used by both "cross" combiners and the two bin indices, i.e., b* and d* settings for both band envelopes. These pairs and indices must share a common multiplexer setting based on the construction of the dual-band basis functions in Equation 10 and Equation 11. These controls may be used to set a different tapped delay line setting between, for example, $u_L(n)$ and $\psi_{L,b*}(|u_L(n-v)|) \cdot \psi_{U,d*}(|u_U(n-v)|)$. Note also, that multiplexers 83a and 83b provide control to the dual band tap combiners 82a and 82b, respectively.

Accumulators 86a and 86b sum together outputs of the combiners for each band across the full complement of dual-band tap structures supported by the hardware. FIG. 11 shows that the hardware provides a total of P parallel circuits to implement dual-band tap structures. In practice, a value of P=8 or P=16 might be used depending on the nature of the PA to be predistorted, and the degree to which it is expected to be driven into saturation. The compliment of P parallel circuits needs to be provisioned to provide sufficient memory depth in the M dimension and also sufficient time-skew products in the V dimension of Equation 10 and Equation 11.

Thus, in some embodiments, when there are a plurality of bands, the method includes forming cross products of the spline functions of the different bands; and multiplying the cross products at each knot by a respective tap weight; and wherein generating the pre-distorted signal includes adding a sum of tap-weighted cross products to the sum of tap-weighted products. In some embodiments, the method includes selecting, by multiplexers, different ones of the delayed input signals and spline functions to be included in the pre-distorted signal.

Figure 12:
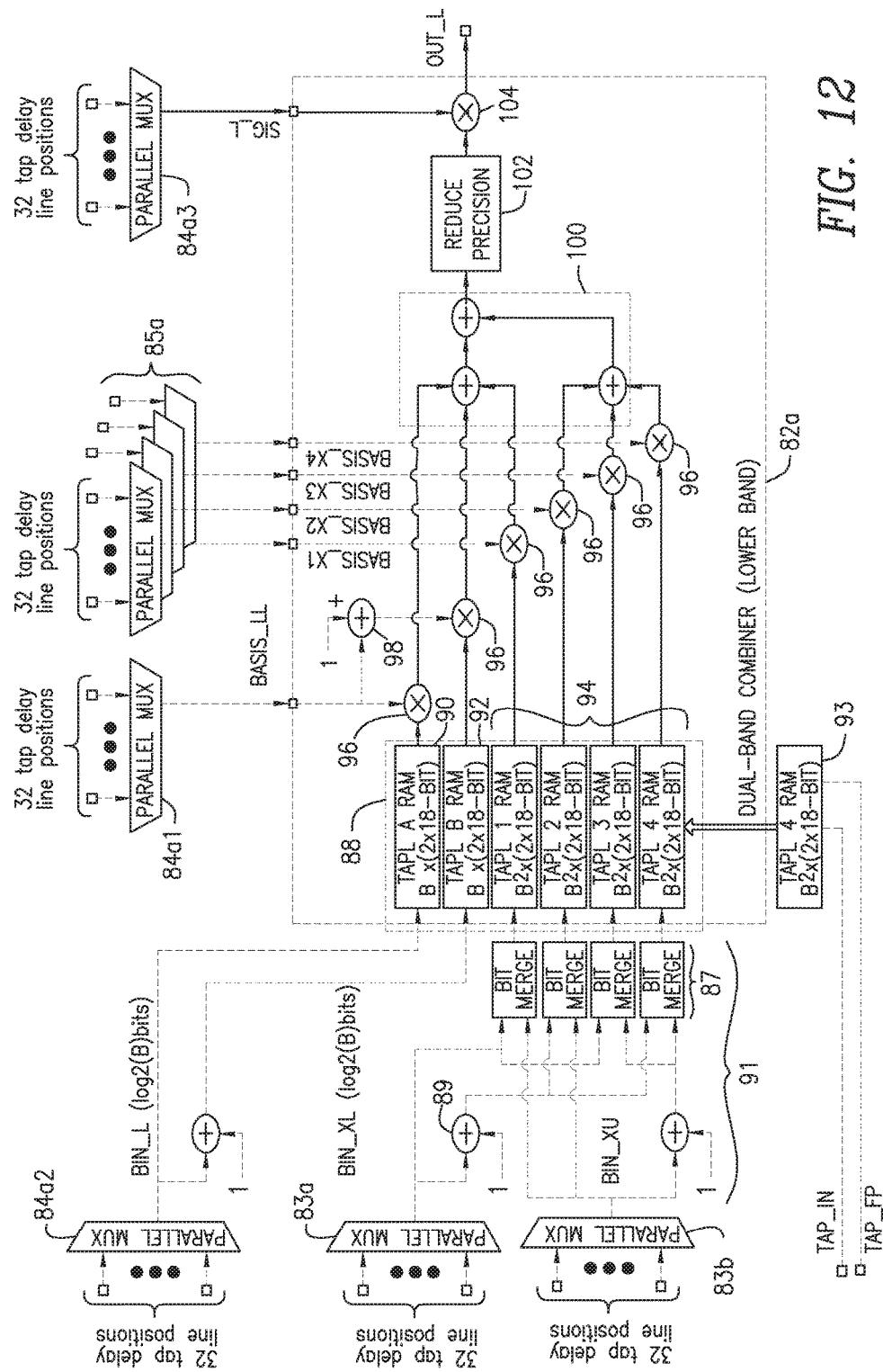
FIG. 12 is a block diagram of a dual-band tap combiner.

The rectangular dual-band tap combiner 82a for the lower band is shown in FIG. 12, and which performs the computation of Equation 10 for a single time delay/skew assignment (m,v) as determined by the multiplexer settings. A purpose of the circuitry of FIG. 12 is to determine the tap weight inputs to tap weights adaptation circuitry that is described below. The circuitry of FIG. 12 has the following features:

Redundant copies of the B complex-valued "thru" tap weights $\{w_{L,b*}(\bullet)\}$ are stored in memories TAPL_A 90 and TAPL_B 92 of a memory bank 88 in order to allow the simultaneous lookup of tap weights at indices b* and b*+1. Similarly, four redundant copies of the $B^2$ complex-valued "cross" tap weights $x_{L,b*,d*}(\bullet)$ are stored in memories TAPL_1 through TAPL_4 94 of memory bank 88 to allow the simultaneous lookup of the tap weights at indices (b*,d*), (b*+1,d*), (b*,d*+1), and (b*+1,d*+1), as computed by adder 89 and bit merge units 87 which combine to implement cross tap indices formation unit 91. The outputs of the bit merge units 87 address the memory 94 to selecting which one of 256 cross products are to be output by the memory 94.

Real-valued basis functions BASIS_LL (or $\psi_{L,b*}(|u_L(n)|)$) of Equation 10), and BASIS_X1 through BASIS_X4 (corresponding to the four rectangular distortion products of Equation 9) are input to the tap weight multipliers 96 requiring two real-valued multiplications each. The adder 98 of the tap combiner 82a re-computes basis function BASIS_LR (or $\psi_{L,b*+1}(|u_L(n)|)$) rather than implementing tapped-delay line and parallel multiplexing structures to pass it directly from the front-end hardware.

The tap weight outputs are combined by adders 100 together at high precision. The precision of the output sum is reduced by precision reducer 102 prior to the final multiplication by the signal value SIG_L (or $u_L(n)$) by the multiplier 104.

The dual-band tap combiner 82a performs 16 real-valued multiplications per sample to synthesize the complete pre-distorted signal for single band.

The dual-band tap combiner 82b for the upper band has identical structure to that shown in FIG. 12 with the roles of lower and upper band signals reversed accordingly.

Thus, in some embodiments, calculating the sum of tap-weighted products includes, for each bin: multiplying a tap weight determined for a left knot of the bin by a right spline of the left knot to form a first product; multiplying a tap weight determined for a right knot of the bin by a left spline of the right knot to form a second product; summing the first product and the second product to form a first sum; and multiplying the first sum by a value of the delayed input signal.

Some of the embodiments described above outlining a DPD architecture based on overlapping low-complexity splines provide at least some of the following advantages:

The difficulties associated with implementing high order nonlinearities in fixed-point hardware, and the inherent lack of flexibility with conventional architectures based on GMP (including 2D-DPD) are avoided due to the application of a piecewise approximation approach to synthesizing a nonlinear distortion function.

Unlike cubic spline interpolation which performs piecewise approximation but requires complex 1D polynomial evaluation that becomes even more cumbersome for 2D dual band systems, the current disclosure replaces a complex cubic interpolation with the direct efficient computation of two overlapping low-cost spline basis functions. Consequently, the disclosure avoids large 1D LUTs with limited precision and prohibitive 2D LUTs, and obviates the need of re-computing LUT contents for tap adaptation purposes in favor of admitting the use of conventional adaptive filter techniques.

Some embodiments provide a robust and flexible framework for single-band and dual-band distortion synthesis where the basis function selection, bin and knot assignment, rectangular or polar 2D signal envelope representation, and signal envelope scaling and/or pre-emphasis may all be selected appropriately to maximize modeling capability and performance or to tune computational complexity to meet desired implementation requirements.

Some embodiments provide an architecture that can provide thousands of tap weights to model a dual-band signal, yet only require hardware for implementing 10 active tap weights per time delay on any particular data sample. This provides a very economical solution that can be adapted directly using low-cost, closed-loop adaptive filtering techniques such as Least Mean Square (LMS) as compared to conventional GMP-based schemes requiring least squares processing and matrix inversion or decomposition to solve for the tap weights.

To summarize implementation of the lower and upper actuators of Equations 10 and 11:

Each actuator provides P hardware branches to synthesize the distortion products.

A flexible delay line and multiplexing architecture allows software configurable selection of the time/skew indices for each distortion product component. A similar set of time/skew indices apply for the upper band; a cross-band index is common for both bands.

The set of B tap weights $\{w_{L,b}(p)\}$ assigned to overlapping quadratic splines $\psi_{L,b}(\bullet)$ synthesize the "thru" distortion for the lower band. The architecture provisions P×B "thru" tap weights in total per band. Since only two neighboring splines $\psi_{L,b*}(\bullet)$ and $\psi_{L,b*+1}(\bullet)$ are non-zero by construction, only two "thru" weights are active per band on any particular sample n. The active splines are identified by index pairs (b*,b*+1) and (d*,d*+1) for the lower and upper bands, respectively. The set of B tap weights $\{w_{U,d}(p)\}$ provide a similar function for the upper band.

The set of $B^2$ tap weights $\{x_{L,b,d}(p)\}$ assigned to all possible cross-product combinations of the overlapping quadratic splines $\psi_{L,b}(\bullet)$ and $\psi_{U,d}(\bullet)$ synthesize the "cross" distortion for the lower band. The architecture provides P×$B^2$ "cross" tap weights in total per band. A total of four cross products corresponding to the two pairs of non-zero splines per band are active per band on any particular sample n. The set of $B^2$ tap weights $\{x_{U,b,d}(p)\}$ provide a similar function for the upper band.

Overall, in some embodiments, the concurrent dual-band DPD scheme provides P×(B+$B^2$) tap weights per band for synthesis and modeling of distortion products, but only 6·P tap weights are active per band on any particular sample n.

Returning to Equations 10 and 11 for the dual band actuators, it is useful to express the DPD actuator functions in vector form to simplify the description of tap weight adaptation algorithms to follow. To this end, collect the lower band "thru" weights into a P·B×1 vector $w_{LT}$, the lower band "cross" weights into a P·$B^2$×1 vector $w_{LX}$, and then collect those together into a single P·(B+$B^2$)×1 vector $w_L$ capturing all weights for the lower band. Define a set of vectors in a similar fashion for the upper band as shown in Equation 14.

$$w_{LT} = [w_{L,0}(0), \ldots, w_{L,B-1}(0), \ldots, w_{L,0}(P-1), \ldots, w_{L,B-1}(P-1)]^T$$

$$w_{LX} = \begin{bmatrix} x_{L,0,0}(0), \ldots, x_{L,B-1,B-1}(0), \ldots, \\ x_{L,0,0}(P-1), \ldots, x_{L,B-1,B-1}(P-1) \end{bmatrix}^T$$

$$w_L = [w_{LT}^T, w_{LX}^T]^T$$

$$w_{UT} = \begin{bmatrix} w_{U,0}(0), \ldots, w_{U,B-1}(0), \ldots, \\ w_{U,0}(P-1), \ldots, w_{U,B-1}(P-1) \end{bmatrix}^T$$

$$w_{UX} = \begin{bmatrix} x_{U,0,0}(0), \ldots, x_{U,B-1,B-1}(0), \ldots, \\ x_{U,0,0}(P-1), \ldots, x_{U,B-1,B-1}(P-1) \end{bmatrix}^T$$

$$w_U = [w_{UT}^T, w_{UX}^T]^T$$

Equation 14

In a similar way, the data signals that multiply each tap weight in Equations 10 and 11 may be collected into the rows of a data matrix (one row for each sample n). Data samples $d_{LT}(n)$ multiply weights $w_{LT}$, samples $d_{LX}(n)$ multiply weights $w_{LX}$, and data samples $d_L(n)=[d_{LT}(n), d_{LT}^T(n)]^T$ multiply weights $w_L$ for the lower band, and similarly for the upper band. The resulting actuator expressions may then be written for a vector $y_L(n)=[y_L(n) \ldots, y_L(n-D)]^T$ and $y_U(n)=[y_U(n), \ldots, y_U(n-D)]^T$ as shown in Equation 15.

$$y_L(n) = \begin{bmatrix} d_{LT}^T(n) & d_{LX}^T(n) \\ d_{LT}^T(n-1) & d_{LX}^T(n-1) \\ \vdots & \vdots \\ d_{LT}^T(n-D) & d_{LX}^T(n-D) \end{bmatrix} \cdot \begin{bmatrix} w_{LT} \\ w_{LX} \end{bmatrix}^* \equiv D_L(n) \cdot w_L^*$$

$$y_U(n) = \begin{bmatrix} d_{UT}^T(n) & d_{UX}^{T(n)} \\ d_{UT}^{T(n-1)} & d_{UX}^T(n-1) \\ \vdots & \vdots \\ d_{UT}^{T(n-D)} & d_{UX}^{T(n-D)} \end{bmatrix} \cdot \begin{bmatrix} w_{UT} \\ w_{UX} \end{bmatrix}^* \equiv D_U(n) \cdot w_U^*$$

Equation 15

The tap weights $w_L$ and $w_U$ for the DPD actuators of Equations 10 and 11 may be solved using a least squares procedure that minimizes the mean squared error between the actuator outputs and desired reference inputs $z_L(n)$ and $z_U(n)$ (taken either as $y_L(n)$ and $y_U(n)$ or $u_L(n)$ and $u_U(n)$ based on the chosen learning architecture, as outlined above, and collected into vectors $z_L=[z_L(n), \ldots, z_L(n-D)]^T$ and $z_U=[z_U(n), \ldots, z_U(n-D)]^T$. The solution is given by Equation 16.

$$w_L = (D_L^\dagger \cdot D_L)^{-1} \cdot (D_L^\dagger \cdot z_L)$$

$$w_U = (D_U^\dagger \cdot D_U)^{-1} \cdot (D_U^\dagger \cdot z_U)$$

Equation 16

The solution to Equation 16 requires inversion of the matrices $A_L \equiv (D_L^\dagger \cdot D_L)^{-1}$ and $A_U \equiv (D_U^\dagger \cdot D_U)^{-1}$. The Cholesky decomposition $A_L \equiv L_L \cdot L_L^\dagger$ with back-substitution often provides a feasible yet costly solution in practice.

The "stochastic gradient" (SG) or "least mean squares" (LMS) algorithm adaptively solves for the tap weights in Equation 17, thus providing an alternative to the least squares approach that is computationally less complex than the least squares approach. The update equations are given in Equation 17 where $\mu_L$ and $\mu_U$ are the step-size parameters for the lower and upper bands, respectively.

$$e_L(n) = z_L(n) - w_L^\dagger \cdot d_L(n)$$

$$e_U(n) = z_U(n) - w_U^\dagger \cdot d_U(n)$$

$$w_L(n+1) = w_L(n) + \mu_L \cdot d_L(n) \cdot e_L^*(n)$$

$$w_U(n+1) = w_U(n) + \mu_U \cdot d_U(n) \cdot e_U^*(n) \quad \text{Equation 17}$$

The standard LMS algorithm can suffer from gradient noise amplification since its update term, for example $d_L(n) \cdot e_L^*(n)$ in Equation 17, is directly proportional to the data input vector. For applications where the data can exhibit large statistical fluctuations, this drawback can be avoided with the normalized LMS algorithm of Equation 18, where the update term is normalized with respect to the squared norm of the data input vector.

$$e_L(n) = z_L(n) - w_L^\dagger \cdot d_L(n) \quad \text{Equation 18}$$

$$e_U(n) = z_U(n) - w_U^\dagger \cdot d_U(n)$$

$$w_L(n+1) = w_L(n) + \frac{\mu_L}{|d_L(n)|^2} \cdot d_L(n) \cdot e_L^*(n)$$

$$w_U(n+1) = w_U(n) + \frac{\mu_U}{|d_U(n)|^2} \cdot d_U(n) \cdot e_U^*(n)$$

The least squares tap weight solution has three primary drawbacks that limit its application in practice:

Cost/Complexity—inversion of D×D matrices $A_L$ and $A_U$ requires $O(D^3)$ operation, where D is the number of time samples n over which the data matrices $D_L$ and $D_U$ are collected. For a DPD actuator with N total tap weights, typically $D \geq 10 \cdot N$ is required to yield a well-characterized solution in practice. Since the DPD actuator may have $N=P \cdot (B+B^2)=2176$ for $P=8$ and $B=16$, the required D approaches tens of thousands of samples. Inversion of such a huge matrix quickly becomes infeasible at low cost in either software or hardware for the actuators of Equations 10 and 11.

Numerical Instability—the numerical computations performed during a matrix inverse can exhibit severe stability problems in which small perturbations to the input can cause huge variations in the output, yielding unreliable results. The condition number $\kappa(A) = |\lambda_{max}/\lambda_{min}|$ of a matrix A provides a measure of the degree to which the matrix may be "ill-conditioned". Given the basis functions used by the DPD are not fully orthogonal, the condition number $\kappa(A)$ may be high in certain cases.

Limited Adaptation Rate—typically tap weights adapted via least squares are updated on a "block-by-block" basis, where data matrices $A_L$ and $A_U$ are collected over a block, a new set of taps is solved from Equation 16, those new taps are installed into the DPD actuators of FIG. 1, and the process repeats in order to track non-stationary PA characteristics due to temperature variation. The least squares adaptation of the actuators of Equations 10 and 11 will exhibit a poor adaptation rate due to the relatively large block size D required to solve its system of normal equations.

The standard LMS algorithm exhibits slow convergence behavior when then eigenvalue spread of the matrices $A_L$ and $A_U$ is large. In addition, the stepsize parameter must be set carefully in relation to the strength of the correlation matrix eigenvalues or else instability may result. These issues are particularly problematic for non-linear systems. Indeed, the DPD actuators of this disclosure demonstrate this typical behavior with the standard LMS algorithm of Equation 17. Instability is observed unless the step-size parameters $\mu_L$ and $\mu_U$ are set very small, and otherwise convergence of the taps does not occur and appears to be swamped by the tap noise inherent in the large number of small-valued tap weights related to the cross-terms.

The normalized LMS algorithm of Equation 18 does a poor job of solving the gradient noise amplification problem for the DPD actuator since the instantaneous magnitude ($|d_L(n)|^2$ or $|d_U(n)|^2$) provides an unreliable estimate of the average tap input power of the actuators.

Figure 13A:
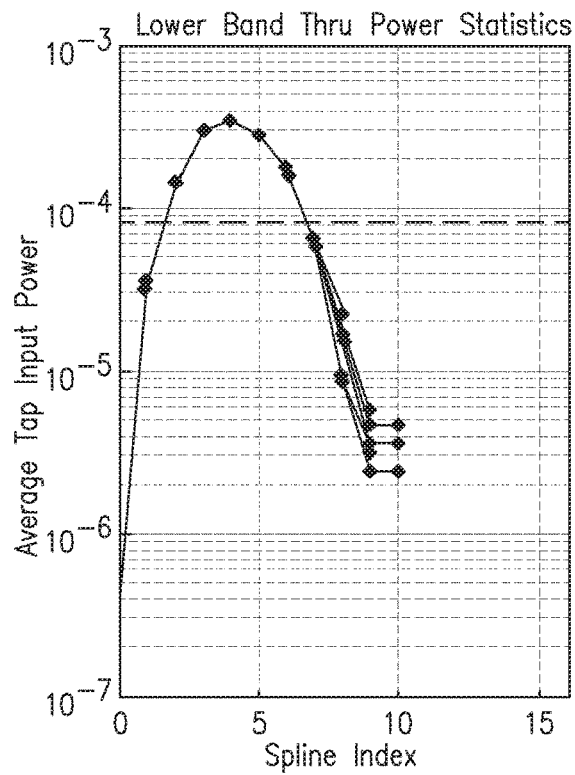
FIG. 13 is a graph of average tap weight input power for thru weights.
Figure 13B:
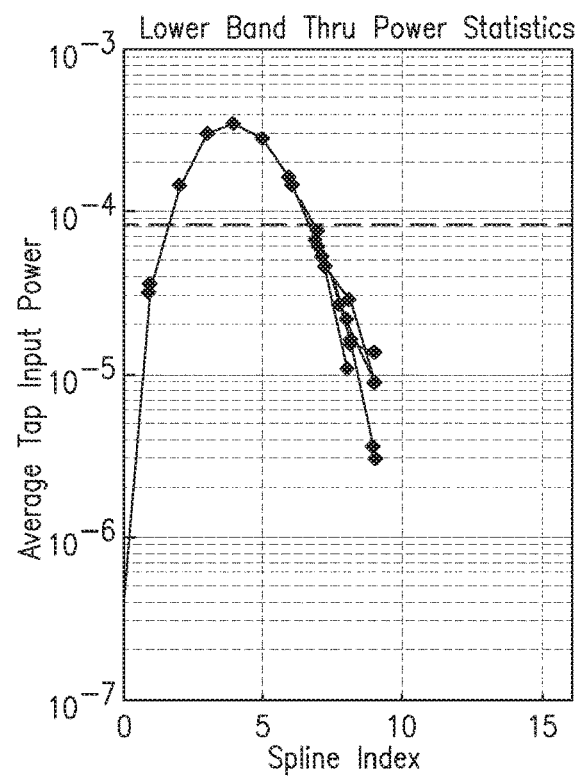
Figure 14A:
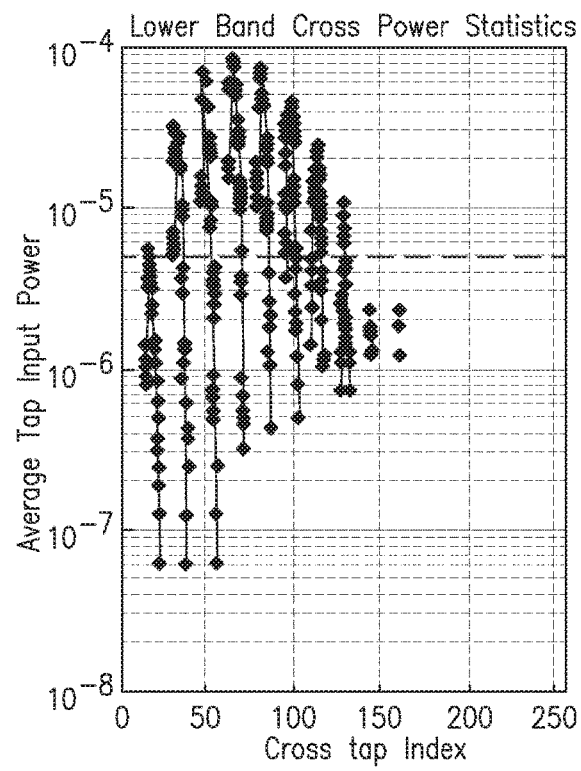
FIG. 14 is a graph of average tap weight input power for cross weights.
Figure 14B:
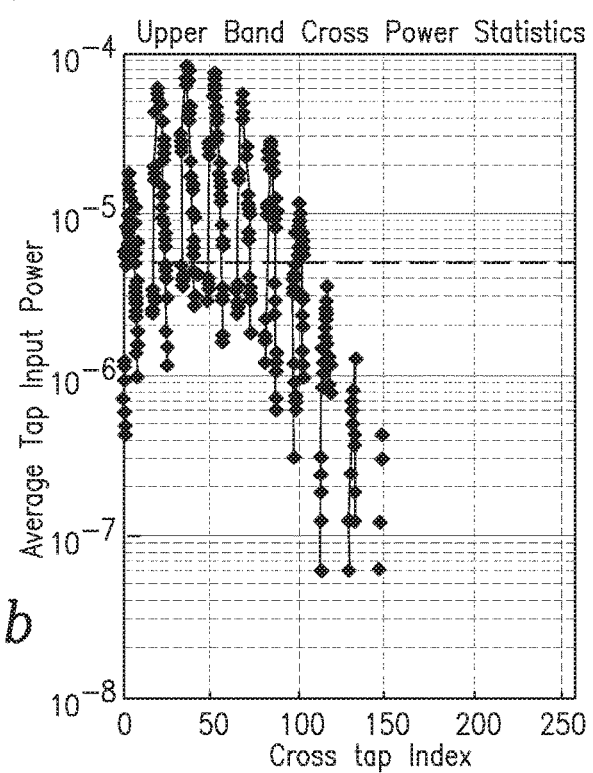

Indeed, FIGS. 13 and 14 show simulation results of the average tap input power as a function of tap index for the "thru" (FIG. 13) and "cross" (FIG. 14) taps in the left and right side plots, respectively, over the suite of P sets of tap weights. These results show that the average tap input power varies widely over three orders of magnitude as a function of the tap index. The dashed lines in FIGS. 13 and 14 show the tap input power averaged over all of the "thru" or "cross" taps, indicating even the average power $E\{|d_L(n)|^2\}$ or $E\{|d_U(n)|^2\}$ is not sufficient to normalize the adaptation across the wide range of tap input strengths. Thus, the normalized LMS algorithm cannot be used successfully to adapt the tap weights of the DPD actuators of Equations 10 and 11 due to the wide variability of the tap input magnitudes across its suite of tap weights; the normalized LMS algorithm suffers from instability and very poor convergence behavior due to these characteristics.

Some embodiments provide a novel closed-loop algorithm to perform the initial acquisition of the tap weights for the concurrent dual-band DPD actuator based on overlapping splines, and to provide real-time adaptive tracking of tap weights for continuous operation in non-stationary conditions. The algorithm is low-cost and suitable for efficient implementation in fixed-point hardware, and does not suffer from the drawbacks of high-cost, poor numerical stability and limited adaptation rates inherent with the LMS algorithms in the prior art. In particular, some embodiments provide a novel tap-specific power normalization scheme to modulate the step size used for each tap according to its observed average input power. Some embodiments use a logarithmic step-size normalization for low-cost hardware implementation. A block-based LMS update strategy and power statistic gathering circuitry address directly the unique probabilistic nature of the dual-band concurrent signal to yield robust operation in non-stationary environments.

Figure 15:
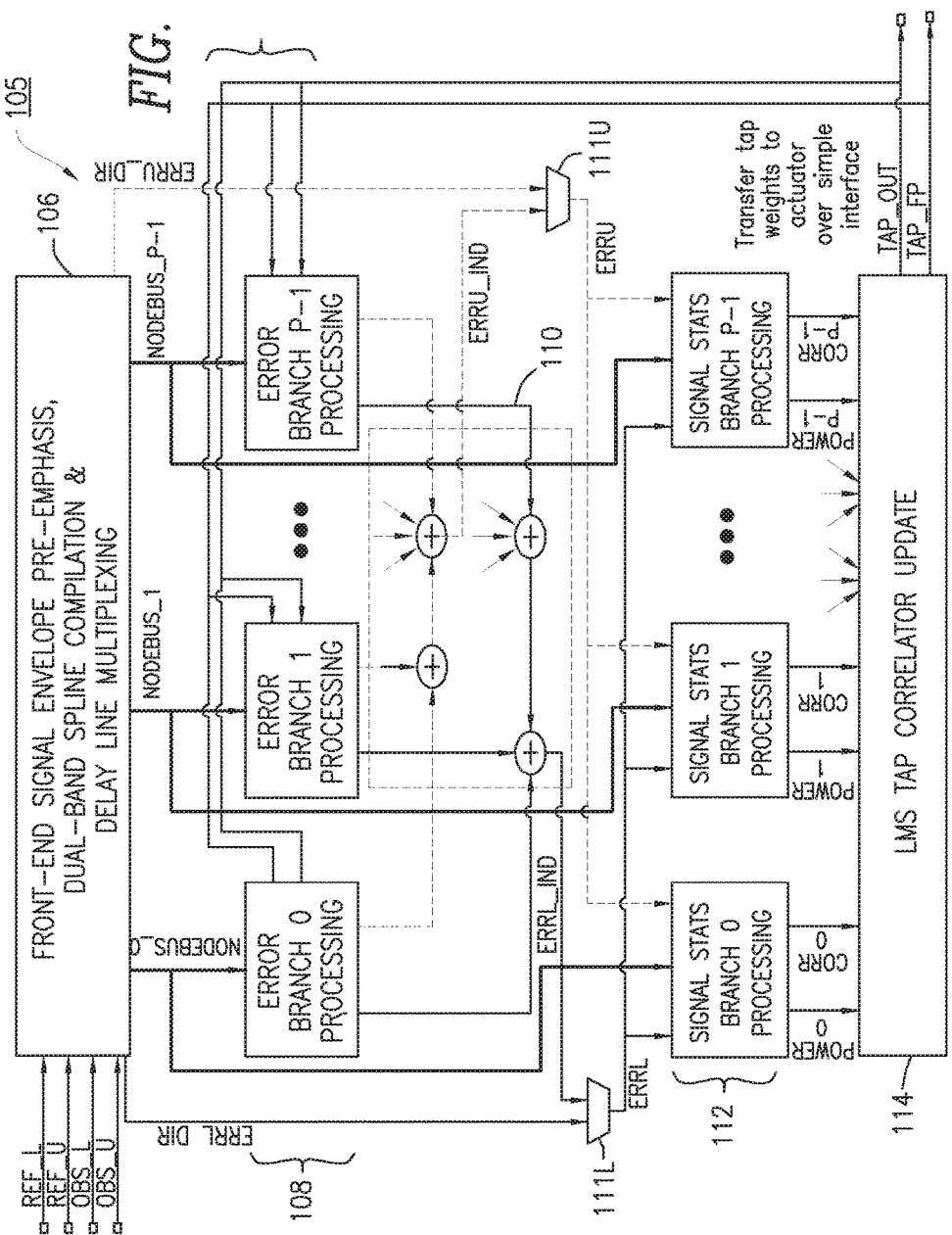
FIG. 15 is a block diagram of adaptation hardware for computing tap weights.

Some embodiments provide a novel closed-loop algorithm to perform the initial acquisition and real-time adaptation of the tap weights for the concurrent dual-band DPD actuator of Equations 10 and 11 based on overlapping splines. FIG. 15 shows a block diagram of exemplary adaptation hardware 105 for computing tap weights. The following points summarize the high level operation of the circuitry of FIG. 15:

One embodiment assumes the actuator and adaptation hardware are partitioned, perhaps into two different devices or two different blocks within the same device.

The adaptation hardware maintains the "master" copy of the P·(B+B²) tap weights per band and updates their values according to a "computation schedule" in closed-loop fashion, and transfers the updated tap weights to the actuator hardware over a simple interface. Here, P is the number of dual band tap combiners implemented by the actuator, which should provide for sufficient memory depth which may be, for example, 8, and time skew. B is the number of bins which may be, for example 16.

Some embodiments provide both "direct" and "indirect" learning schemes as described above.

For "direct" learning, the reference inputs REF_L and REF_U are set to signals $u_L(n)$ and $u_U(n)$, the observation inputs OBS_L and OBS_U are set to signals $r_L(n)$ and $r_U(n)$ shown in FIG. 1, and the error signal(s) are formed as the difference between the two (as computed by the "front-end processing" block of FIG. 15.).

For "indirect" learning, the reference inputs REF_L and REF_U are set to signals $y_L(n)$ and $y_U(n)$, the observation inputs OBS_L and OBS_U are set to signals $r_L(n)$ and $r_U(n)$ shown in FIG. 1, and the error signal(s) are formed as the difference between the reference signal(s) and the output of the "DPD actuator model" shown in which is implemented by the preferred embodiment by the "Error Branch Processing" of FIG. 15.

The error signal for direct learning or indirect learning is selected by multiplexers 111U and 111L.

Thus, in some embodiments, the adaptation hardware 105 selectively operates in one of a direct mode to compute a difference between an input signal and an observation signal and an indirect mode to compute a difference between an output of the DPD and an output of a DPD actuator model, the DPD actuator model computing an estimate of a pre-distorted signal.

The Front-end processing 106 of adaptation hardware 105 replicates functions from the DPD actuator so that the full complement of tap weight input signals $d_L(n)$ and $d_U(n)$ required for tap weight adaptation may be re-computed by the adaptation hardware. The tap weight input signals are the spline functions multiplied by the delayed input signals. In principle, these signals could be obtained directly from the DPD actuator, but the bandwidth is prohibitive particularly for systems where actuator and adaptation are partitioned to different devices. So re-computation is preferable for most embodiments. Front-end processing 106 includes signal envelope computation and pre-emphasis, dual-band overlapping spline computations and delay-line multiplexing, similar to that described above with reference to FIG. 11.

The Error Branch Processing 108 implements the "DPD actuator model" required by the "indirect" learning architecture, and consists of P identical branch circuits that each produce one component of the error signal required for "indirect" adaptation. The adder tree 110 in FIG. 15 combines together these outputs. Note the "Error Branch Processing" 108 maintains a "slave" copy of the updated tap weights exactly as is done in the DPD actuator 68.

The multiplexers 111L and 111U selectively couple a source of an error statistic from the front end processing 106 and adders 110 for the purpose of selecting between the error of indirect learning and the error of direct learning.

Figure 17:
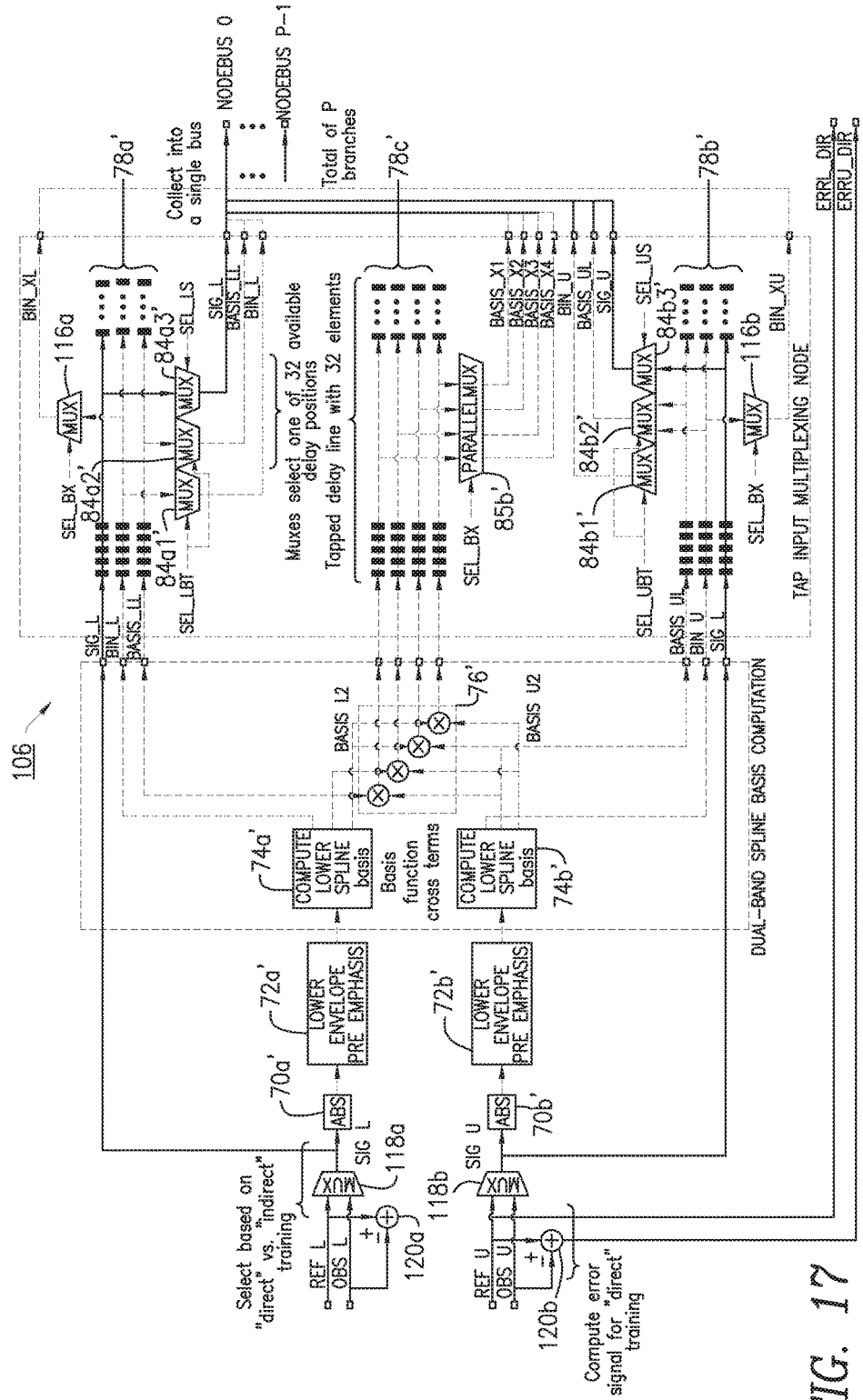
FIG. 17 is a block diagram of front end spline processing circuitry.

The Signal Statistics Processing 112 implements two functions of the adaptation. The first function collects average power statistics for the full complement of tap weight input signals $d_L(n)$ and $d_U(n)$ that drive the tap-specific power normalization which makes LMS adaptation of the DPD actuator possible. The second function performs the conventional "data x error" correlation required by the standard LMS algorithm, as shown in FIG. 17. The embodiment implements a total of P identical branch circuits.

The LMS Tap Correlator Update 114 applies the average tap input power statistics and LMS data correlations produced by the Signal Statistics Processing 112 to perform the novel tap-specific power-normalized LMS algorithm to update the tap weights in a closed-loop fashion. A single hardware correlator is time-shared across the full set of 2P·(B+B²) tap weights in serial fashion, processing one tap weight update every clock cycle. The updated tap weights are streamed out to the DPD actuator 68 (and the Error Branch Processing 108 for "direct" learning) over a parallel interface at a rate of one tap weight per clock according to the "computation schedule" discussed with reference to FIG. 16.

Equation 19 describes the closed-loop adaptation scheme described herein for updating the tap weights of the DPD actuator 68 with overlapped splines of Equation 6.

$$e_L(n) = z_L(n) - w_L^\dagger \cdot d_L(n)$$
$$e_U(n) = z_U(n) - w_U^\dagger \cdot d_U(n)$$
$$\Delta_{L,K}(k) = \sum_{l=0}^{\lfloor K/S \rfloor - 1} d_L(n \cdot K + l \cdot S) \cdot e_L^*(n \cdot K + l \cdot S)$$
$$\Delta_{U,K}(k) = \sum_{l=0}^{\lfloor K/S \rfloor - 1} d_U(n \cdot K + l \cdot S) \cdot e_L^*(n \cdot K + l \cdot S)$$
$$w_L(k+1) = w_L(k) + \mu_L \cdot P_L(k) \cdot \Delta_{L,K}(k)$$
$$w_U(k+1) = w_U(k) + \mu_U \cdot P_U(k) \cdot \Delta_{U,K}(k)$$

Equation 19

The following points describe features of the closed loop adaptation scheme:

An identical algorithm is applied to each band independently. The solution incorporates the required cross-coupling between bands automatically through the data vectors $d_L(n)$ and $d_U(n)$ that each contain the appropriate inputs from both bands.

Equation 19 describes a "Block-based LMS" algorithm in which the tap weight vectors are updated once every K samples. This form of LMS is adopted for its compatibility with the need to estimate reliably the tap input average power statistics required for successful power normalization of the update equation.

Embodiments compute the power and "data x error" correlation statistics $\Delta_{L,K}(k)$ and $\Delta_{U,K}(k)$ with a "sub-sampling" hardware implementation to reduce computational complexity. The statistics are accumulated once every S samples. This reduces the cost of the statistics gathering hardware in the "Error Branch Processing" 108 and "Statistics Branch Processing" 112 circuits of FIG. 15 by a factor S.

The diagonal matrices $P_L(k)$ and $P_U(k)$ implement a tap-specific power normalization of the LMS update, where $P_L(k)=\text{diag}[p_{L,0}(k), \ldots, p_{L,P\cdot(B+B^2)-1}(k)]$ provides a set of $P\cdot(B+B^2)$ power normalization controls for the lower band, and $P_U(k)=\text{diag}[p_{U,0}(k), \ldots, p_{U,P\cdot(B+B^2)-1}(k)]$ provides a similar capability for the upper band. These power statistics are measured over the same set of samples as $\Delta_{L,K}(k)$, i.e., every S samples over a block of K samples. Some embodiments provide unique power normalization for each tap in the actuator. To reduce the cost of the normalization hardware, the control $p_{L,b}(k)=\lfloor -\log_2 E\{d_{L,b}^2(n)\}\rfloor$ for the b-th tap weight $w_{L,b}(k)$ is implemented as a "bit shift" related to the binary logarithm of the average power of the tap weight input signal $d_{L,b}(n)$ for that tap. These tap input average power statistics (shown in FIGS. 13 and 14) provide foundation for the power-based normalization provided by this disclosure. The tap input average power statistics may also be used to determine useful mapping functions for LUT-based signal envelope pre-emphasis as outlined above to optimize the DPD actuator 68 performance.

Tap weights where the average power $E\{d_{L,b}^2(n\cdot K+l\cdot S)\}=0$ are measured as exactly zero for the particular block of K samples and are not updated by the LMS algorithm for that iteration.

Figure 16:
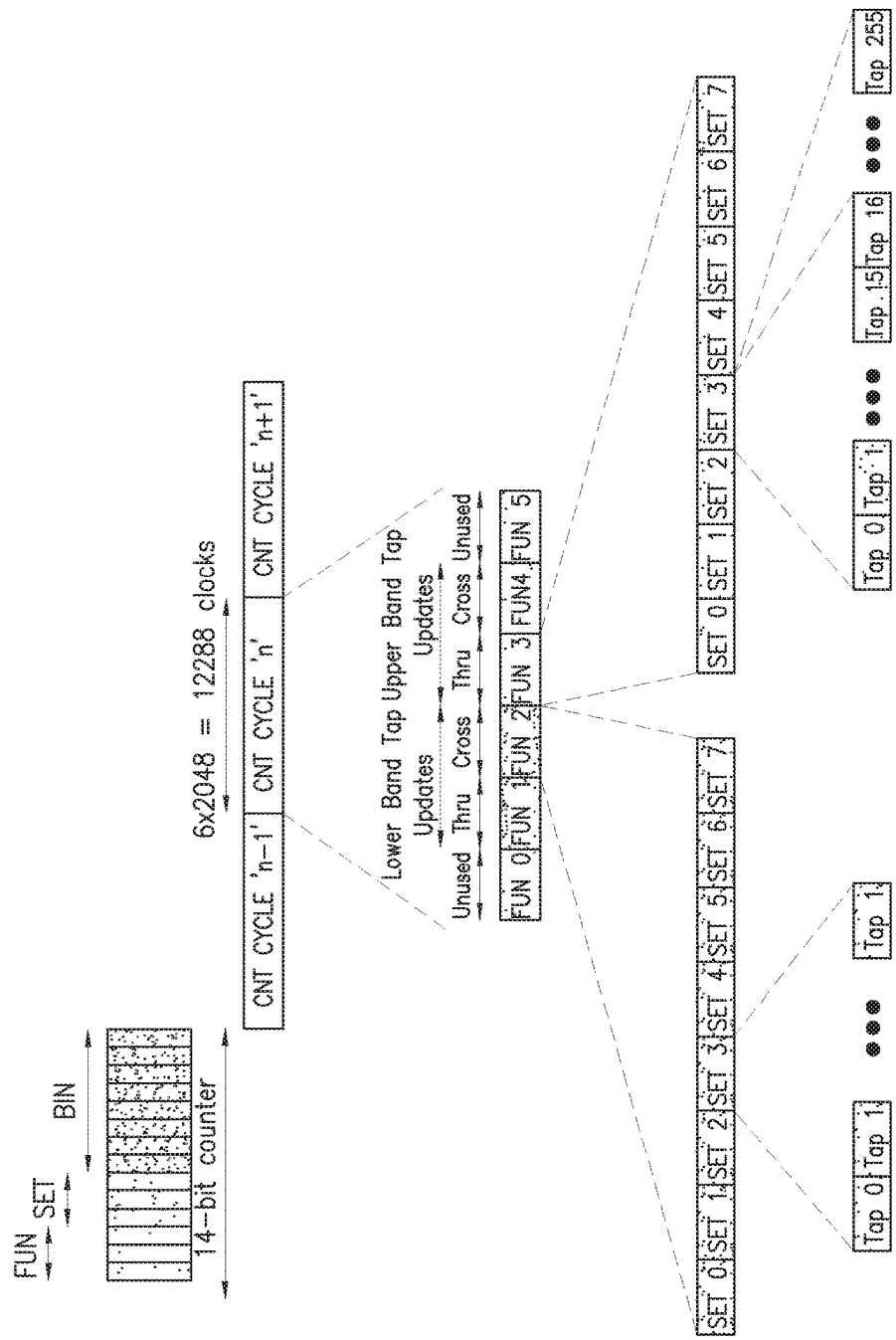
FIG. 16 is tap update and transfer schedule.

FIG. 16 illustrates the tap update and transfer schedule for some embodiments. The adaptation hardware performs the LMS update in Equation 19 once every K samples, where K=12288 is chosen for illustrative purpose in this embodiment. In the embodiment of FIG. 16, B=16 overlapping splines with P=8 actuator branches, so that there are a total of $2P\cdot(B+B^2)=4352$ tap weights to update once every K=12288 samples. The schedule of FIG. 16 is configured to satisfy the following requirements:

A full update of Equation 19 is performed once every K samples, but schedules the computations so that only one tap weight is updated per sample to save hardware. A "ping/pong" memory management scheme allows tap weights to be updated based on Equation 19 using statistics gathered over the previous block, while the hardware processes the input signals for the current block.

The lower band tap weights are updated and transferred during phases "FUN 1" and "FUN 2" of the cycle, whereas the upper band tap weights are updated and transferred during phases "FUN 3" and "FUN 4". Phases "FUN 0" and "FUN 5" are unused. The designation, FUN, stands for function. The exemplary cycle is partitioned into 6 different functions with tap weights being updated/transferred by LMS during FUN1-FUN4, inclusive.

Each phase spans $P\cdot B^2=2048$ samples corresponding to the total number of cross-term tap weights required for a particular band.

There are some "unused" portions of the schedule in "FUN 1" and "FUN 3" for the thru-term tap weights since they number B instead of $B^2$.

The value of K is chosen larger than $2P\cdot(B+B^2)$ to allow a sufficient number of samples to be used for the estimation of the power statistics used to compute $P_L(n)$ and $P_U(n)$. Given the large peak-to-average ratio of typical wideband LTE signals, a fairly large block size K is required to achieve reliable stable power estimates across the full complement of tap weight inputs. The inclusion of "wait states" "FUN 0" and "FUN 5" provide a means for this power statistic settling to occur.

FIG. 17 shows the front-end spline processing 106 for some embodiments. This circuitry replicates many of the same functions performed by the DPD actuator 68 which may be partitioned in a different device, where like elements are like-numbered and perform like functions. The circuitry produces various components of the tap weight input signals $d_L(n)$ and $d_U(n)$ required for tap weight adaptation, along with the associated control parameters such as the overlapping spline basis function values and their corresponding indices.

The front-end processing replicates the signal envelope computation, pre-emphasis, and delay line multiplexing of the DPD actuator 68 so that each tap weight input signal may be computed for adaptation. Details are described above with reference to FIG. 11.

Multiplexers 116a and 116b receive the signal BIN_L and BIN_U and output BIN_XL and BIN_XU, respectively. BIN_XL and BIN_XU are used to form bin indices for the cross terms, BASIS_X1-BASIS_X4.

Input multiplexing 118a and 118b allows a common front-end processing circuit to operate in either a "direct" and "indirect" learning configuration as selected via software control.

The front-end processing also computes the error signal required for adaptation in the "direct" learning configuration from the difference between the "reference" and "observation" inputs. In particular, the adders 120a and 120b calculate the error signals for direct learning to be input to multiplexers 111L and 111U of FIG. 15.

Figure 18:
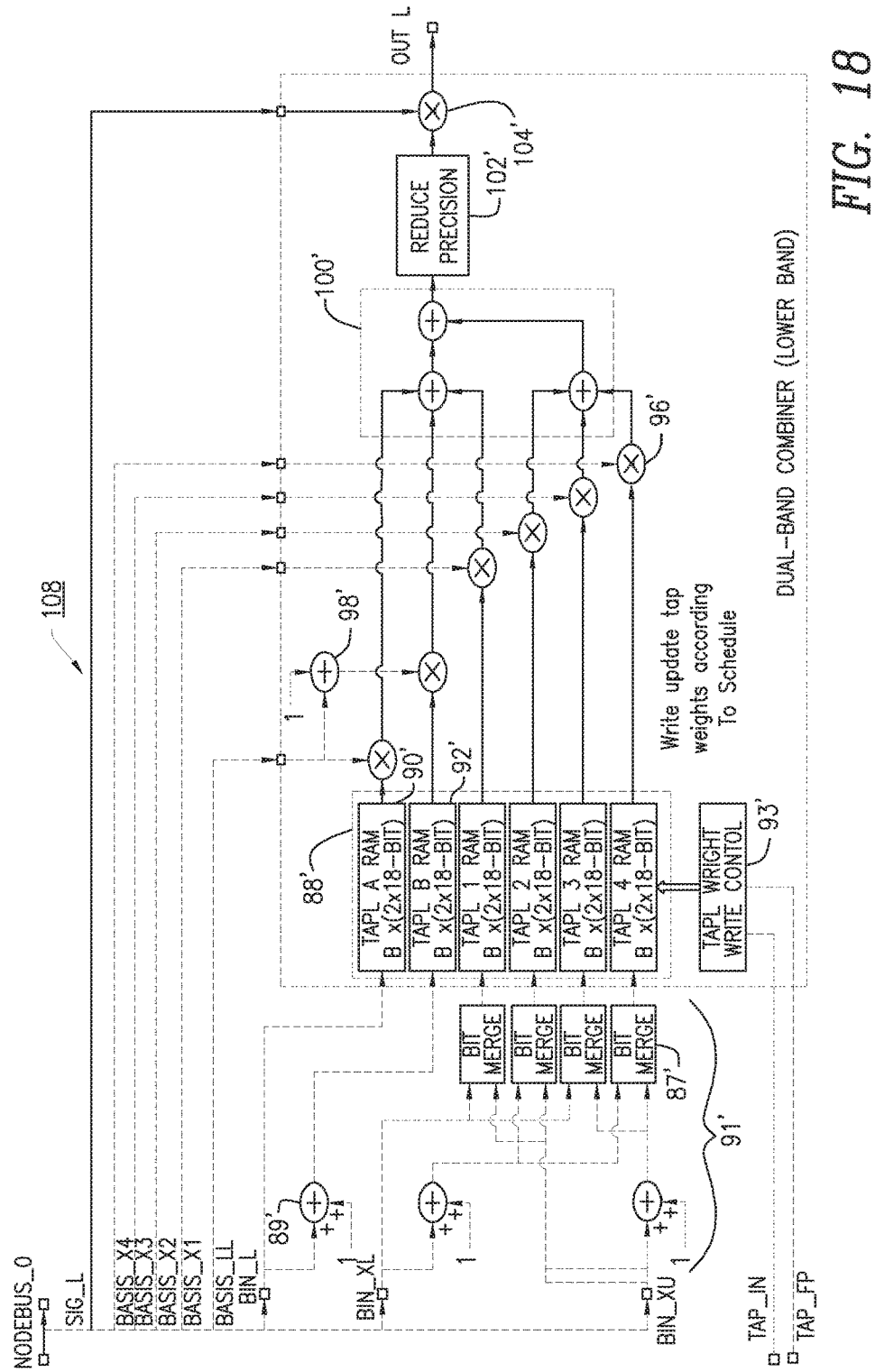
FIG. 18 is block diagram of circuitry for error branch processing.

FIG. 18 shows circuitry for the Error Branch Processing 108 to support "indirect learning." This embodiment implements P identical branches of the circuitry in total. The circuitry in FIG. 18 replicates exactly the function of a "Dual-Band Tap Combiner" of FIG. 12, where like elements are like numbered and perform like functions.

In FIG. 18, redundant copies of the B complex-valued "thru" tap weights $\{w_{L,b*}(\bullet)\}$ are stored in memories TAPL_A and TAPL_B in order to allow the simultaneous lookup of tap weights at indices b* and b*+1. Similarly, four redundant copies of the $B^2$ complex-valued "cross" tap weights $x_{L,b*,d*}(\bullet)$ are stored in memories TAPL_1 through TAPL_4 to allow the simultaneous lookup of the tap weights at indices (b*,d*), (b*+1,d*), (b*,d*+1), and (b*+1,*+1).

Real-valued basis functions BASIS_LL and BASIS_X1 through BASIS_X4 are input to the tap weight multipliers 96', requiring two real-valued multiplications each. The tap combiner 106 re-computes basis function BASIS_LR rather than implementing tapped-delay line and parallel multiplexing structures to pass it directly from the front-end hardware.

The tap weight outputs are combined together by adders 100' at high precision. The precision of the output sum is reduced by precision reducer 102' prior to the final multiplication by the signal value SIG_L in multiplier 104'. The circuit 106 performs 16 real-valued multiplications per sample to synthesize the complete predistorted signal for single band. The dual-band tap combiner for the upper band has identical structure to that shown in FIG. 18 with the roles of lower and upper band signals reversed accordingly.

The tap weight write control unit 122 controls the writing of the tap weights based on the schedule of FIG. 16.

Figure 19:
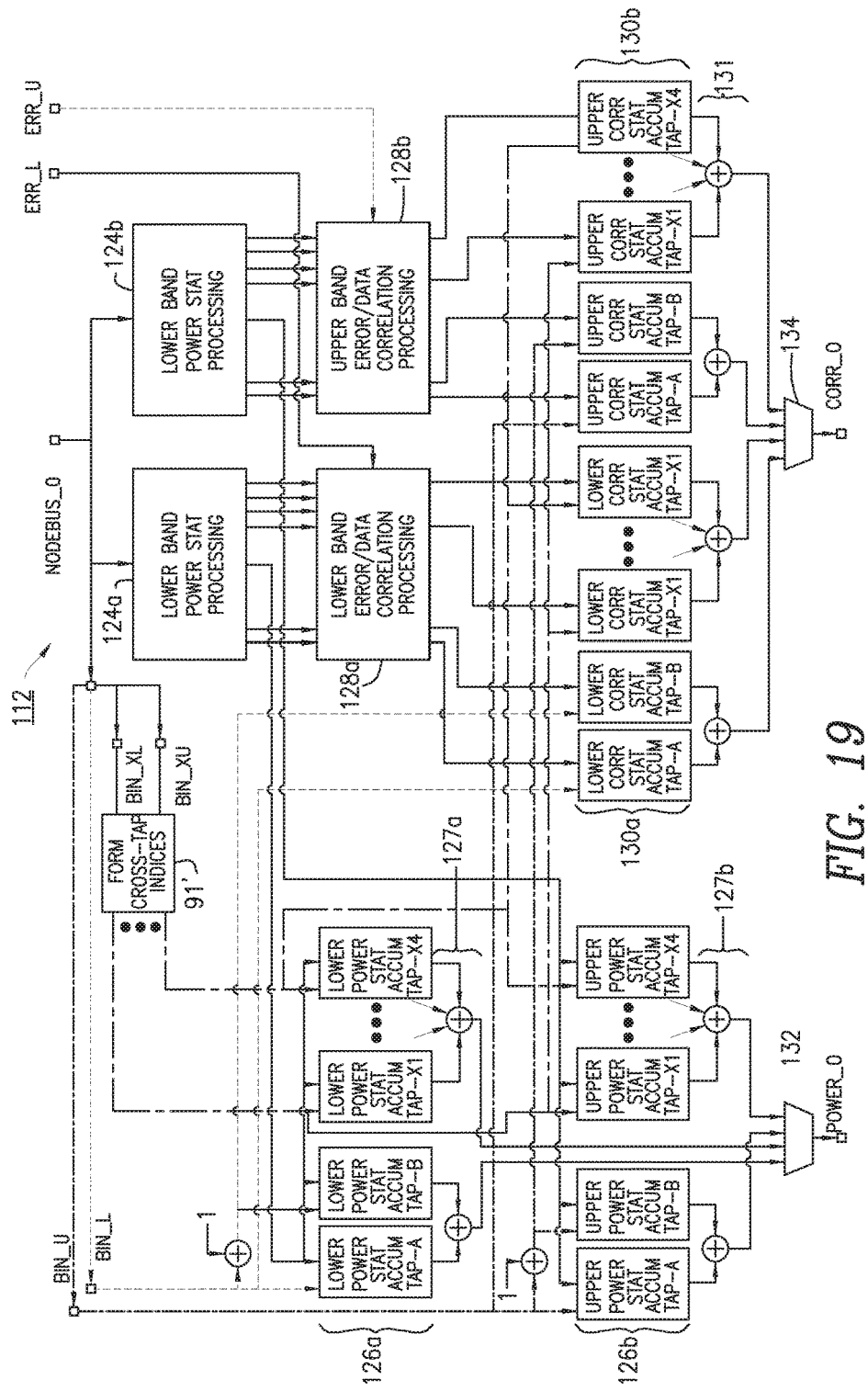
FIG. 19 is a block diagram of circuitry for signal statistics branch processing.
Figure 20:
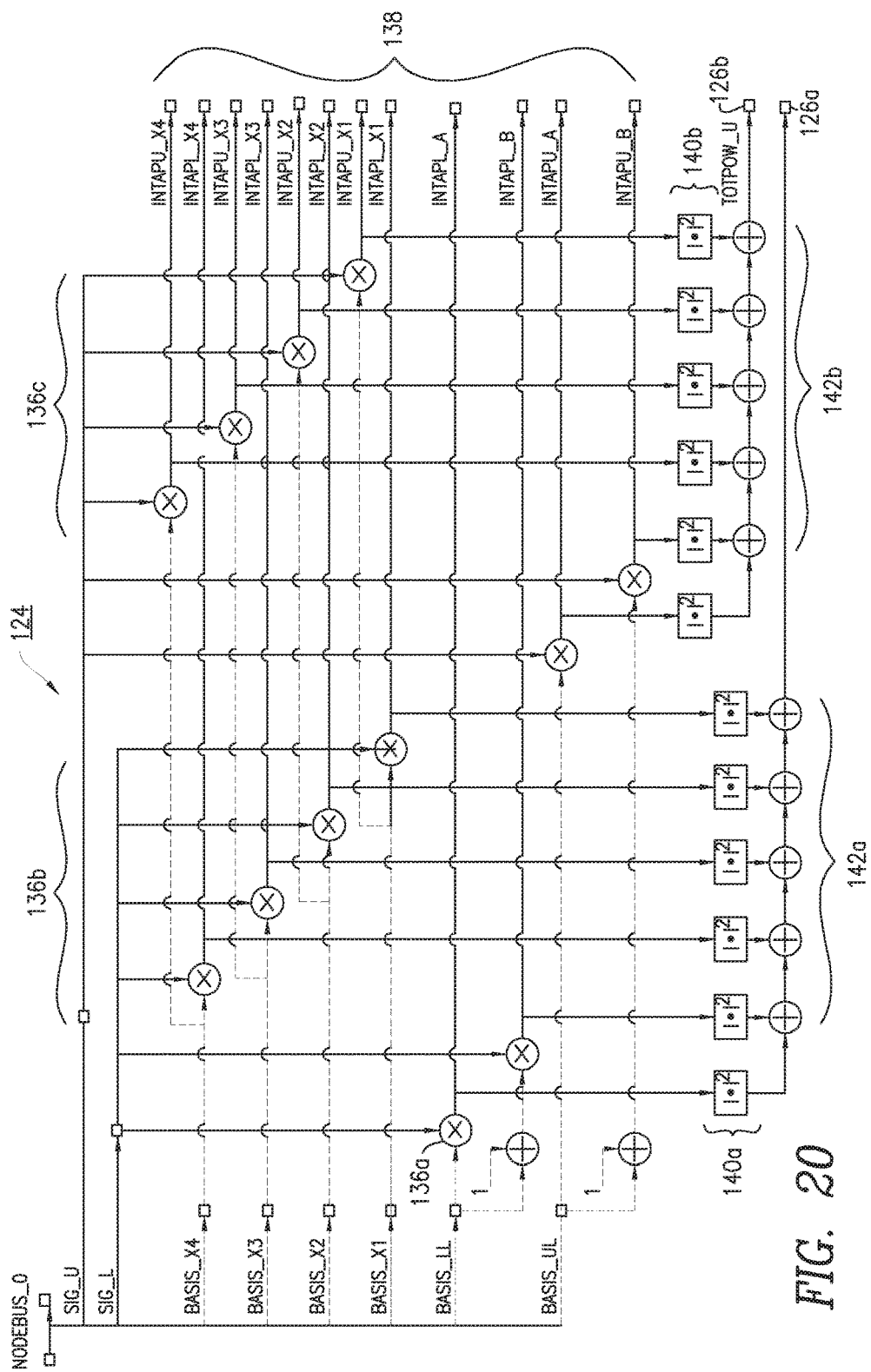
FIG. 20 is a block diagram of circuitry for power stat processing.

FIG. 19 shows a block diagram of the circuitry required for Signal Statistics Branch Processing 112. There are P identical branches of the circuitry in total. The signal statistics branch processing hardware performs the following functions:

- Lower and upper band POWER STAT PROCESSING blocks 124a and 124b compute the instantaneous powers of the current input sample to each of the six active tap weights once every S input samples. These input power statistics are fed to bank of memory blocks for accumulation over a block of K samples. The power stat processing blocks 124a and 124b receive cross tap indices from a cross tap indices unit 89' which selects the particular cross tap weights to be computed in the current clock cycle. Blocks 124 are shown in FIG. 20.
- The lower and upper band POWER STAT PROCESSING blocks 124a and 124b also compute the actual input signals to each of the six active tap weights for each band once every S input samples, and deliver these to downstream logic that accumulates over a block of K samples the "data x error" correlation statistics required to perform LMS adaptation of the tap weights.
- Lower and Upper band POWER STAT ACCUM memory blocks 126a and 126b for TAP_A, TAP_B, TAP_X1, TAP_X2, TAP_X3, and TAP_X4 accumulate average power statistics for the associated tap weight input signals. The circuit provides a set of memory blocks for each band. Once every S input samples, the contents of one memory location in each block is accumulated with the instantaneous power of the current sample input to that active tap weight. The accumulated results are added together by adders 127a and 127b for the lower and upper accumulators 126a and 126b, respectively, and combined by the multiplexer 132 as POWER_O, where POWER_O is the average power of the tap input currently being updated by the LMS according to the schedule of FIG. 16.
- The lower and upper band "ERROR/DATA CORRELATION PROCESSING" units 128a and 128b compute the instantaneous "data x error" correlations of the current input samples once every S input samples and feeds these results to a bank of memory blocks 130a and 130b for accumulation over a block of K samples.
- Lower and upper band "CORR STAT ACCUM" memory blocks 130a and 13b, for TAP_A, TAP_B, TAP_X1, TAP_X2, TAP_X3, and TAP_X4, accumulate data/error correlation statistics for the associated tap weight input signals. The circuit provides a set of memory blocks for each band. One memory location in each block is accumulated once every S input samples with the instantaneous data/error correlation of the current inputs to that active tap weight. The accumulated results are added by adders 131 and fed to a multiplexer 134 to output CORR_O, where CORR_O is the correlation statistic for the tap input currently being updated by the LMS according to the schedule of FIG. 16. Note that the POWER STAT ACCUM and CORR STAT ACCUM accumulate results for the current CNT_CYCLE while generating outputs from the previous CNT_CYCLE.
- Outputs are summed together for the "thru" statistics from memory blocks TAP_A and TAP_B, whereas the "cross" statistics are summed together from memory blocks TAP_X1, TAP_X2, TAP_X3 and TAP_X4 to produce one final set of statistics for each of the "thru" and "cross" taps. The same output statistics collection approach is used for both power and "data/error" correlation statistics.

FIG. 20 shows the POWER STAT PROCESSING circuitry 124 of FIG. 19 in detail. The power stat processing circuitry 124 generates the products of input signals and basis functions in multipliers 136a, 136b and 136c, as needed, to re-compute the signals input to each of the six active tap weights in each band. These twelve tap weight inputs 138 are fed to downstream hardware for "data/error" correlation processing. Magnitude units 140a and 140b calculate the instantaneous power of the tap weight inputs 138 and add them together by adders 142a and 142b to obtain a single "instantaneous power" statistic for the current sample instant. Downstream hardware accumulates this statistic in each of the memory bank addresses corresponding to the current twelve active tap weights.

Figure 21:
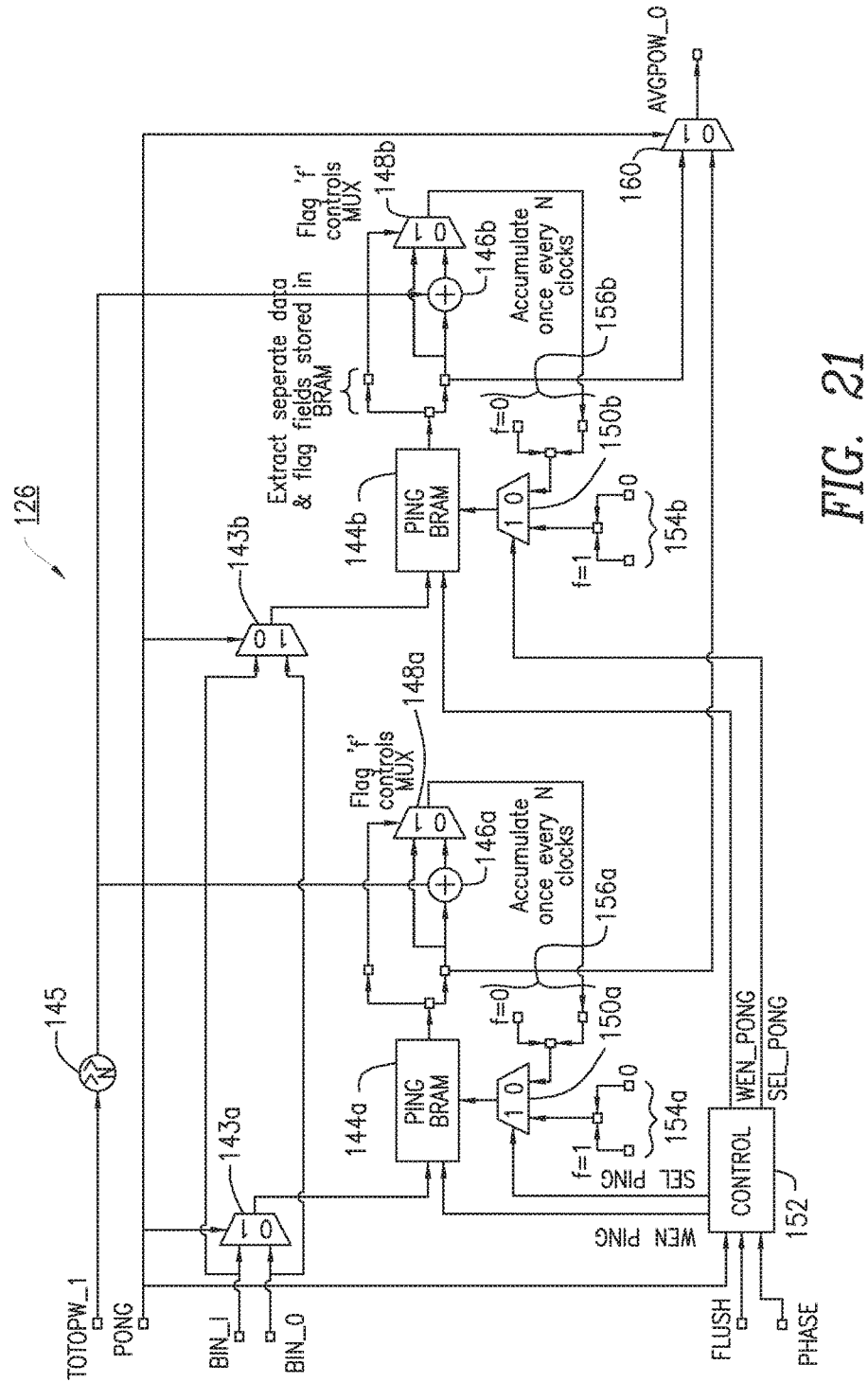
FIG. 21 is a block diagram of power stat accumulation circuitry.

FIG. 21 shows the details of the POWER STAT ACCUM blocks 126 of FIG. 19 used to accumulate the average power statistics of each tap weight input. The circuit operates as follows:

- The hardware adopts a "ping/pong" scheme in which input statistics are gathered over K samples in a first memory 144a while the final results are extracted simultaneously from a second memory 144b. After each K samples, the roles of each memory are reversed.
- The memories 144a and 144b store a compound data element at each address consisting of the current value of the power statistic for that address, along with a single "flag" bit that indicates whether or not that address has been visited since the beginning of the current block of K samples.
- Each new input sample TOTPOW_I is added by an adder 146a to the stored value at address BIN_I if its flag has been set, otherwise the value of TOTPOW_I is stored at address BIN_I since this is the first time this address has been hit for the current block. The flag is cleared immediately upon the first write, and every write thereafter for that block. Multiplexer 148 passes either the accumulated signal or the stored signal to element 156. Multiplexer 150 writes either the passed or recirculated value or the flushed value of zero. Element 154 represents a flush value of zero for the data and 1 for the flag. Element 156 clears the flag and stores the accumulated or recirculated result from multiplexer 148. Control unit 158 determines operation of the circuitry of FIG. 21.
- The output sample AVGPOw_O is read from the non-active memory at address BIN_O based on the tap update schedule outlined in FIG. 16. Every time a memory address is read for delivering an output sample, its contents is flushed and its flag is set to unity to be ready for the next block of K samples.

Thus, in some embodiments, a method of updating tap weights further includes accumulating a computed power average during a first period of time in a first memory while reading a previously computed power average from a second memory, and accumulating a computed power average during a second period of time in the second memory while reading a previously computed power average from the first memory.

Figure 22:
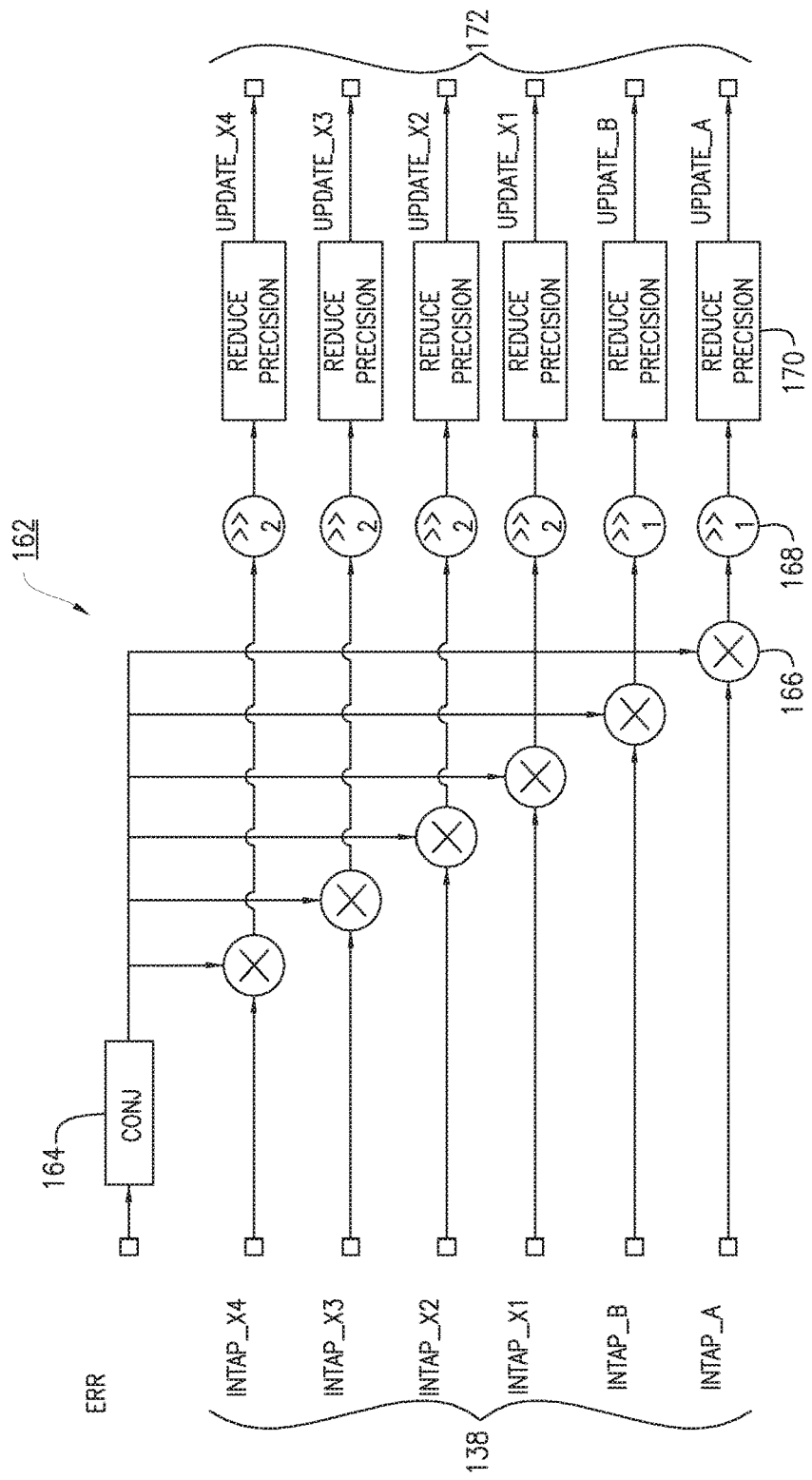
FIG. 22 is a block diagram of data/error correlation circuitry.

FIG. 22 shows the circuitry for "data/error" correlation for some embodiments as computed by error/data correlation processor 128 of FIG. 19. Only functionality for a single band is shown. There are as many instances of this circuitry as there are bands in the input signal. Note that the error signal is conjugated by a conjugator 164, as indicated in Equation 19. The conjugate of the error signal is multiplied at multipliers 166 by the input tap weights received from the output 138 of the power stat processing circuitry 124. The products of the multipliers 166 are shifted right by shift units 168. Precision reducers 170 reduce the precision of the outputs of the shift units 168 to produce the tap weight updates 172. Note that the tap weight updates 172 are accumulated by a circuit similar in form to the circuit of FIG. 21, except that TOTPOW_I is replaced by an update signal of the tap weight updates 172. Thus, there are a total of 6 additional circuits, one for each tap weight update.

Thus, in some embodiments, a method for updating tap weights includes modulating the step size based on a sum of products of a vector of tap weight inputs and a conjugate of an error value, the summation being over a plurality of samples. In some embodiments, the products are computed with a first precision and then reduced to a second precision before being used to update the tap weights.

Figure 23:
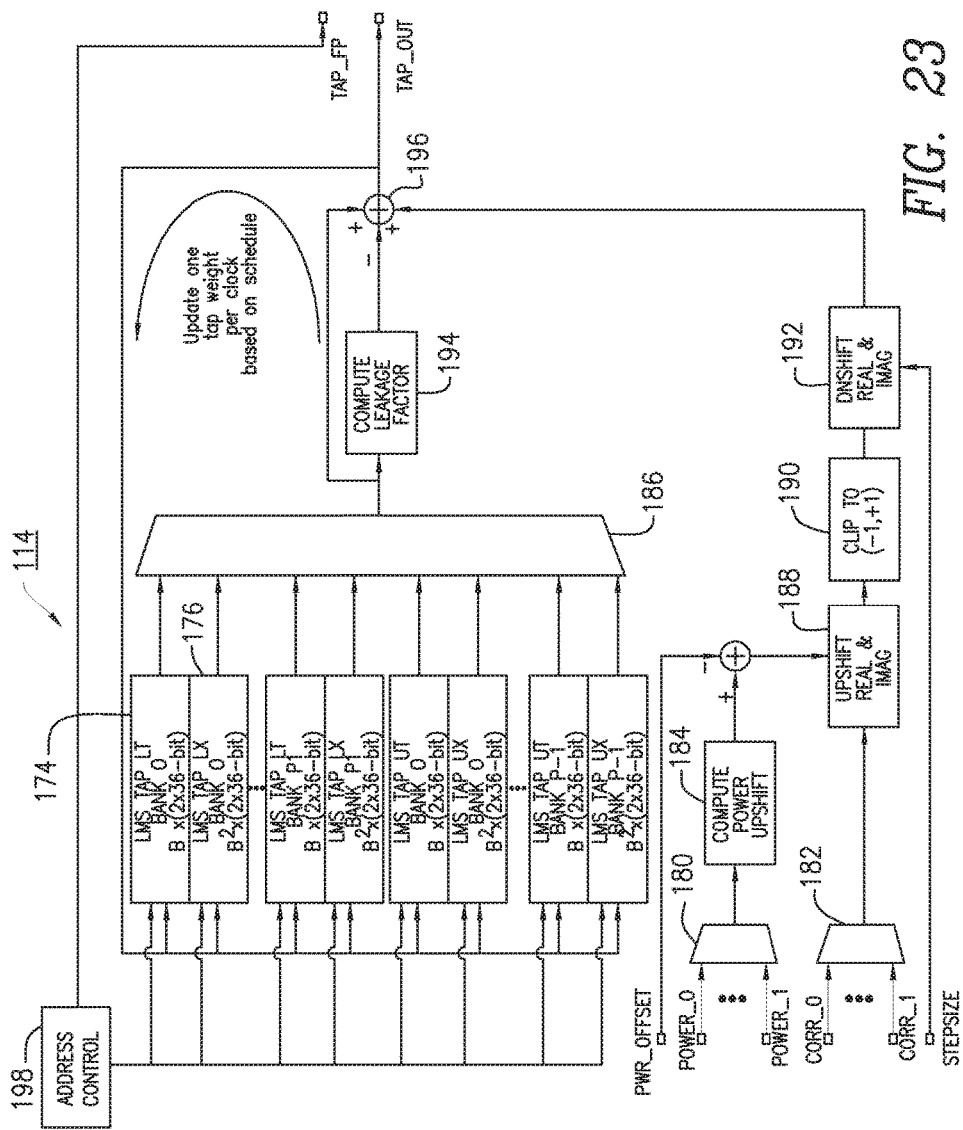
FIG. 23 is a block diagram of a least mean squared tap correlator.

FIG. 23 shows a block diagram of the LMS tap correlator update processing some embodiments and corresponds to element 114 of FIG. 15. The circuit operates as follows:

Some embodiments include a TAP_LT memory bank 172 for the "thru" taps and a TAP_LX memory bank 174 for the "cross" taps for the lower band, and similar memory banks TAP_UT and TAP_UX for the upper band. A total of P copies of each bank 174, 176 are provided to support the P sets of tap weight coefficients in the actuator 68.

The circuit updates one tap weight per sample instant based on the schedule given in FIG. 16. Input multiplexers 180 and 182 select the power normalization and data/error correlation statistic to use for the update from the P available outputs produced by the upstream logic provided by blocks 112 of FIG. 15. A bit shift by power up shifter 184 to be used for power normalization is computed using a priority encoder from the selected power normalization statistic. The selected data/error statistic is upshifted by this amount to effect a power-based normalization that is specific to the current tap weight. Up shifter 184 computes floor(log 2(POWER)) where POWER is the output of the multiplexer 180. For example, if POWER has a value of 0.3, then a binary left shift of −floor(log 2(0.3))=2 would be output by block 184. The left shift of 2 is applied by block 188. Thus, the method includes computing the approximate logarithm, which includes performing a binary shift of a correlation statistic associated with each tap weight The LMS update proceeds according to Equation 19. In some systems, additional "tap leakage" may be incorporated into the update to further improve robustness of the implementation. Block 188 applies the binary left shift independently to the real and imaginary parts of its input. The shift amount is determined by power upshift calculator 184. Block 90 clips the real and imaginary parts independently to +1 or −1 if the left shift causes the magnitude to exceed unity. Block 192 applies a binary right shift independently to the real and imaginary components of its complex input. The amount of shift is supplied by the STEPSIZE input signal.

Once updated, the current tap is written back to its address, and is broadcast simultaneously on the tap output interface so that any "slave" copies of the tap in the DPD actuator and/or "Error Branch Processing" may also be updated.

Figure 24:
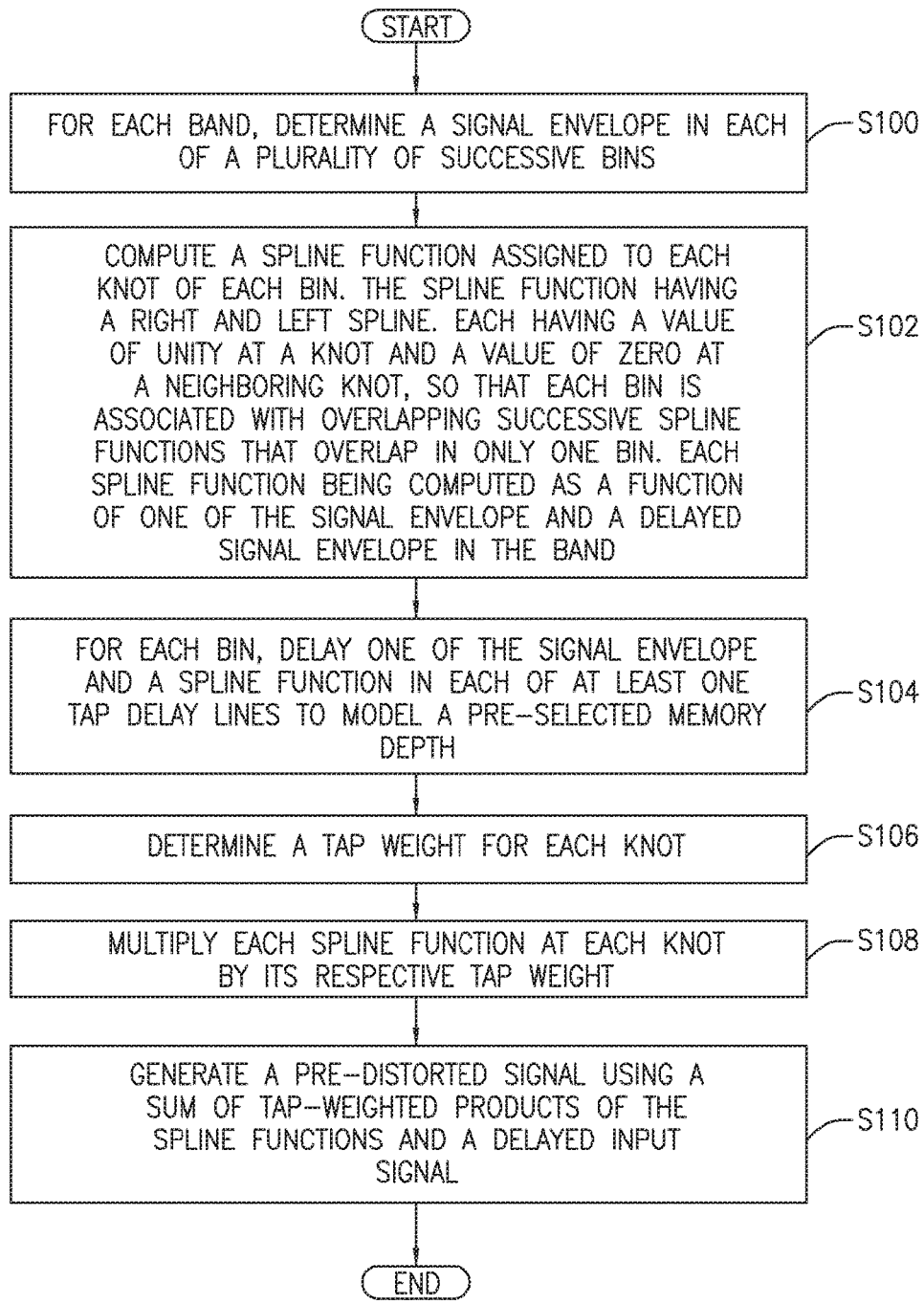
FIG. 24 is a flowchart of an exemplary process for generating a pre-distorted signal.

FIG. 24 is a flowchart of an exemplary process for generating a pre-distorted signal based on overlapping splines. For each band of an input signal, a signal envelope is determined by an absolute value determiner 70 in each of a plurality of successive bins (block S100). A spline function is computed and assigned to each knot of each bin by a spline function calculator 74. The spline function has a right and left spline, each having a value of unity at a knot and a value of zero at a neighboring knot, such that each bin is associated with overlapping successive spline functions that overlap in only one bin. Each spline function is computed by a spline function calculator 34 as a function of one of the signal envelope and a delayed signal envelope of the band (block S102). For each bin, one of the signal envelope and a spline function is delayed in each of at least one tap delay line 78 to model a pre-selected memory depth (block S104). A tap weight is determined for each knot (block S106). Each spline function at each knot is multiplied by its respective tap weight at one of multipliers 96 (block S108). A pre-distorted signal is generated using a sum of tap-weighted products of the spine functions and a delayed input signal (block S110).

Figure 25:
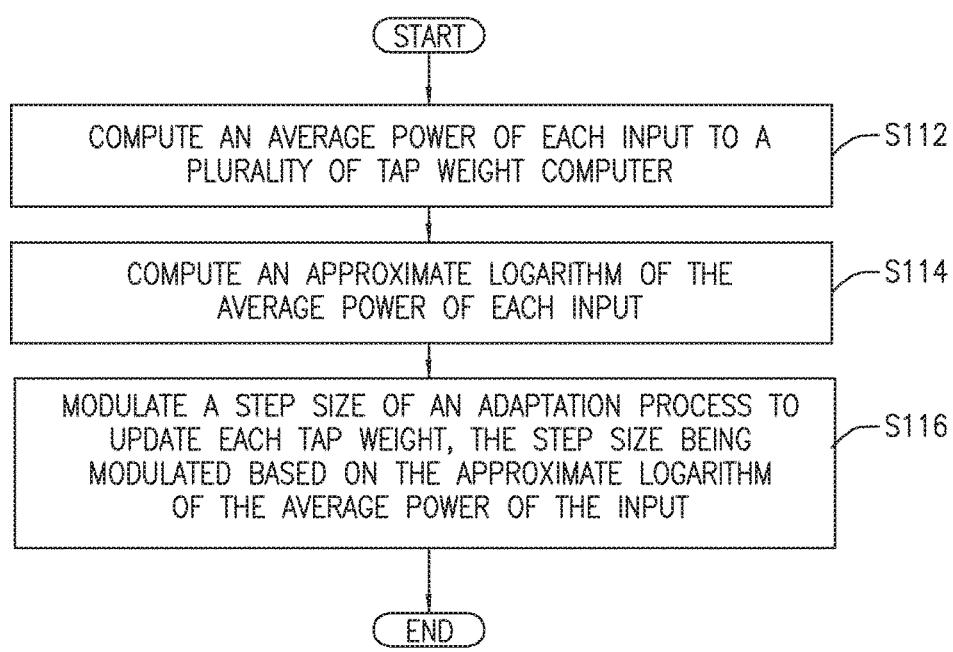
FIG. 25 is flowchart of an exemplary process for modulating a step size of an adaptation process for computing tap weights.

FIG. 25 is a flowchart of an exemplary process for modulating a step size for an adaptation process for updating tap weights. An average power of each input to a plurality of tap weight calculators is computed power determiners 140 (block S112). An approximate logarithm of the average power of each input is computed (block S114). A step size of the adaptation process to update each weight is modulated based on the approximate logarithm of the average power of the input (block S116).

Embodiments include a closed-loop algorithm for acquiring and adapting the complex-valued tap weights of a concurrent multi-band DPD actuator based on overlapping splines.

The closed-loop adaptation algorithm based on an extension to the standard normalized LMS algorithm is low cost, suitable for efficient implementation in fixed-point hardware, and does not suffer from poor numerical stability or the lack of robustness and poor convergence rates of the prior art.

Embodiments support both "direct" and "indirect" learning architectures shown with a single hardware architecture that can be configured via software to support either case.

Embodiments provide adaptation rates that can be orders of magnitude faster than those achievable with block-based least squares solutions, given the large dimensionality of the tap weight space for the DPD actuator based on overlapping splines.

Power normalization circuitry supporting the adaptation algorithm produces a probabilistic characterization of the tap weight space that may be used as an observable metric to classify the non-linear nature or character of the power amplifier undergoing linearization. Such information can be used, for example, to program and tune the LUT-based signal envelope pre-emphasis feature of the DPD actuator that is based on the overlapping spline functions described herein.

It will be appreciated by persons skilled in the art that the present embodiments are not limited to what has been particularly shown and described herein above. In addition, unless mention was made above to the contrary, it should be noted that all of the accompanying drawings are not to scale. A variety of modifications and variations are possible in light of the above teachings without departing from the scope of the following claims.

What is claimed is:

1. A method for digital pre-distortion, DPD, of an input signal to compensate for a non-linear operation of a power amplifier, the method comprising:
for each of at least one band of the input signal:
determining a signal envelope, a signal envelope being determined for each of a plurality of successive bins, each bin having a knot at each edge of the corresponding bin;
computing a spline function assigned to each knot, the spline function having a left spline and a right spline, each of the left spline and the right spline having a value of unity at the knot and a value of zero at left and right neighboring knots, respectively, so that each bin is associated with two overlapping successive spline functions that overlap each other in only one bin, each spline function being computed as a function of one of the signal envelope and a delayed signal envelope in the band;
for each bin, delaying one of the signal envelope and a spline function in each of at least one tap delay line to model a pre-selected memory depth;
determining a tap weight for each knot;
multiplying each spline function at each knot by its respective tap weight; and
generating a pre-distorted signal using a sum of tap-weighted products of the spline functions and a delayed input signal.

2. The method of claim 1, further comprising:
when there are a plurality of bands:
forming cross products of the spline functions of the different bands;
multiplying the cross products at each knot by a respective tap weight; and
wherein generating the pre-distorted signal includes adding a sum of tap-weighted cross products to the sum of tap-weighted products.

3. The method of claim 1, further comprising:
when there are a plurality of bands:
forming inter-band polar spline functions having a magnitude and phase based on the signal envelopes of the plurality of bands;
multiplying the inter-band polar spline functions at each of a plurality of radial knots by a respective tap weight at each knot; and
wherein generating the pre-distorted signal includes adding a sum of tap-weighted polar spline functions to the sum of tap-weighted products.

4. The method of claim 1, further comprising, for each band, scaling the signal envelope and computing the spline function as a function of one of the scaled signal envelope and a delayed scaled signal envelope.

5. The method of claim 1, further comprising, for each band, inputting the signal envelope to a pre-emphasis unit that maps each value of the signal envelope to a scaled value of the signal envelope.

6. The method of claim 5, wherein the mapping is based on cumulative distribution function of the signal envelope.

7. The method of claim 1, further comprising selecting, by multiplexers, different ones of the delayed input signals and spline functions to be included in the pre-distorted signal.

8. The method of claim 1, wherein the generating includes, for each band:
storing each tap weight in a memory;
multiplying the tap weights by spline functions in parallel branches to produce a first set of multiplications;
combining the first set of multiplications; and
multiplying the combined multiplications by a delayed input signal.

9. The method of claim 1, wherein a spline function is given by:

$$\psi_2(a, u) = \begin{cases} \frac{1}{2}\left(\frac{u}{a/2}\right)^2, & 0 \leq u \leq a/2 \\ 1 - \frac{1}{2}\left(\frac{u-a}{a/2}\right)^2, & a/2 \leq u \leq 3a/2 \\ \frac{1}{2}\left(\frac{2a-u}{a/2}\right)^2, & 3a/2 \leq u \leq 2a \end{cases}$$

where "a" is a stretching parameter equal to a bin width, so that the spline function spans a width of two bins.

10. The method of claim 1, wherein a spline function is given by:

$$\psi_3(a, u) = \begin{cases} 2\left(\frac{a-x}{a}\right)^2 \cdot \left[\left(\frac{a-x}{a}\right) - \frac{3}{2}\right] + 1, & 0 \leq u \leq a \\ 2\left(\frac{x-a}{a}\right)^2 \cdot \left[\left(\frac{x-a}{a}\right) - \frac{3}{2}\right] + 1, & a \leq u \leq 2a \end{cases}$$

where "a" is a stretching parameter equal to a bin width, so that the spline function spans a width of two bins.

11. The method of claim 1, wherein the left spline is associated with a first stretching parameter and the right spline is associated with a second stretching parameter different from the first stretching parameter to accommodate adjacent bins of unequal width.

12. The method of claim 1, wherein calculating the sum of tap-weighted products includes, for each bin:
multiplying a tap weight determined for a left knot of the bin by a right spline of the left knot to form a first product;
multiplying a tap weight determined for a right knot of the bin by a left spline of the right knot to form a second product;
summing the first product and the second product to form a first sum; and
multiplying the first sum by a value of the delayed input signal.

13. A digital pre-distorter, DPD, configured to pre-distort an input signal to compensate for a non-linear operation of a power amplifier, the DPD comprising:
an envelope detector configured to determine a signal envelope for each of at least one band of the input signal, a signal envelope being determined for each of a plurality of successive bins, each bin having a knot at each edge of the corresponding bin;
a spline function calculator configured to compute and assign, for each band, a spline function to each knot, the spline function having a left spline and a right spline, each of the left spline and the right spline having a value of unity at the knot and a value of zero at left and right neighboring knots, respectively, so that each bin is associated with two overlapping successive spline functions that overlap each other in only one bin, each spline function being computed as a function of one of the signal envelope and a delayed signal envelope in the band;
tapped delay lines configured to delay, for each bin, one of the signal envelope and a spline function to model a pre-selected memory depth; and a combiner configured to multiply tap weights by the spline functions and delayed input signals to form tap weighted products and to combine the tap weighted products to generate a pre-distorted signal.

14. The DPD of claim 13, further comprising:
a first set of multipliers to form cross products of the spline functions of different bands and a second set of multipliers to multiply each cross product at each knot by a respective tap weight, wherein the combiner generates the pre-distorted signal by adding a sum of tap-weighted cross products to the combination of tap-weighted products.

15. The DPD of claim 13, further comprising:
when there are a plurality of bands:
the spline function calculator is configured to form inter-band polar spline functions having a magnitude and phase based on the signal envelopes of the plurality of bands; and
the combiner is configured to multiply the inter-band polar spline functions at each of a plurality of radial knots by a respective tap weight at each knot; and
wherein generating the pre-distorted signal includes adding a sum of tap-weighted polar spline functions to the sum of tap-weighted products.

16. The DPD of claim 13, further comprising a pre-emphasis unit configured to scale the signal envelope prior to computing the spline function as a function of one the scaled signal envelope and a delayed scaled signal envelope.

17. The DPD of claim 13, further comprising a pre-emphasis unit configured to map each value of the signal envelope to a scaled value of the signal envelope.

18. The DPD of claim 17, wherein the mapping is based on cumulative distribution function of the signal envelope.

19. The DPD of claim 13, wherein the combiner includes, for each band:
a memory configured to store each tap weight;
a plurality of first multipliers configured to multiply the tap weights by spline functions in parallel branches;
a combiner configured to combine the multiplications; and
a second multiplier configured to multiply the combined multiplications by a delayed input signal.

20. The DPD of claim 13 wherein a spline function is given by:

$$\psi_2(a, u) = \begin{cases} \frac{1}{2}\left(\frac{u}{a/2}\right)^2, & 0 \le u \le a/2 \\ 1 - \frac{1}{2}\left(\frac{u-a}{a/2}\right)^2, & a/2 \le u \le 3a/2 \\ \frac{1}{2}\left(\frac{2a-u}{a/2}\right)^2, & 3a/2 \le u \le 2a \end{cases}$$

where "a" is a stretching parameter equal to a bin width, so that the spline function spans a width of two bins.

21. The DPD of claim 13, wherein a spline function is given by:

$$\psi_3(a, u) = \begin{cases} 2\left(\frac{a-x}{a}\right)^2 \cdot \left[\left(\frac{a-x}{a}\right) - \frac{3}{2}\right] + 1, & 0 \le u \le a \\ 2\left(\frac{x-a}{a}\right)^2 \cdot \left[\left(\frac{x-a}{a}\right) - \frac{3}{2}\right] + 1, & a \le u \le 2a \end{cases}$$

where "a" is a stretching parameter equal to a bin width, so that the spline function spans a width of two bins.

22. The DPD of claim 13, wherein the left spline is associated with a first stretching parameter and the right spline is associated with a second stretching parameter different from the first stretching parameter to accommodate adjacent bins of unequal width.

23. The DPD of claim 13, wherein the combiner includes, for each bin:
a first multiplier configured multiply a tap weight determined for a left knot of the bin by a right spline of the left knot to form a first product;
a second multiplier to multiply a tap weight determined for a right knot of the bin by a left spline of the right knot to form a second product;
an adder to sum the first product and the second product to form a first sum; and
a third multiplier to multiply the first sum by a value of the input signal.

* * * * *